United States Patent
Chen et al.

(10) Patent No.: US 12,408,361 B2
(45) Date of Patent: Sep. 2, 2025

(54) SILICIDE-BLOCK-RING BODY LAYOUT FOR NON-INTEGRATED BODY LDMOS AND LDMOS-BASED LATERAL IGBT

(71) Applicant: TEXAS INSTRUMENTS INCORPORATED, Dallas, TX (US)

(72) Inventors: Zaichen Chen, Dallas, TX (US); Akram Ali Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/357,142

(22) Filed: Jun. 24, 2021

(65) Prior Publication Data
US 2021/0408270 A1 Dec. 30, 2021

Related U.S. Application Data

(60) Provisional application No. 63/043,199, filed on Jun. 24, 2020.

(51) Int. Cl.
*H10D 12/00* (2025.01)
*H10D 12/01* (2025.01)
(Continued)

(52) U.S. Cl.
CPC ........... *H10D 12/411* (2025.01); *H10D 12/01* (2025.01); *H10D 30/65* (2025.01); *H10D 62/127* (2025.01)

(58) Field of Classification Search
CPC ............. H01L 29/7393; H01L 29/0696; H01L 29/66325; H01L 29/816; H01L 29/7835; H01L 29/1095; H01L 29/083; H01L 29/1008; H01L 29/0873; H01L 29/0882; H01L 29/0886; H01L 27/0623; H01L 27/0617; H01L 27/0259; H01L 27/088–0928; H01L 29/0646; H01L 29/0642; H01L 29/0653; H01L 29/0843; H01L 29/0852; H01L 29/0865; H01L 29/0692; H01L 29/1029; H01L 29/42312; H01L 29/42316; H01L 29/4232; H01L 29/768; H01L 29/7801; H01L 29/7816–7826; H01L 29/7836; H01L 29/66674; H01L 29/66681–66704; H01L 29/66659; H01L 29/86; H01L 21/823493;
(Continued)

(56) References Cited

U.S. PATENT DOCUMENTS 6,030,864 A * 2/2000 Appel ................. H01L 21/8249
  438/234
8,278,683 B2   10/2012 Kawahara et al.
(Continued)

*Primary Examiner* — Natalia A Gondarenko
(74) *Attorney, Agent, or Firm* — Andrew R. Ralston; Frank D. Cimino

(57) ABSTRACT

An integrated circuit includes a semiconductor substrate having a doped region, e.g. a DWELL, with a first conductivity type. A source region is located within the doped region, the source region having a second opposite conductivity type. A drain region having the second conductivity type is spaced apart from the source region. A gate electrode is located between the source region and the drain region, the gate electrode partially overlapping the doped region. A body region having the first conductivity type is located within the doped region. A dielectric layer forms a closed path around the body region.

21 Claims, 25 Drawing Sheets

(51) Int. Cl.
*H10D 30/65* (2025.01)
*H10D 62/10* (2025.01)

(58) Field of Classification Search
CPC .......... H01L 21/762; H01L 21/823412; H01L 21/823481; H01L 21/823892; H01L 2924/1306; H01L 2924/13063; H01L 29/665; H01L 29/66507; H01L 29/4975; H01L 29/4933; H01L 21/823418; H01L 21/28052; H01L 21/28518; H01L 21/32053; H01L 21/32051
USPC .......................... 257/139, 335, 337, 324, 343
See application file for complete search history.

(56) References Cited

U.S. PATENT DOCUMENTS

| | | | |
|---|---|---|---|
| 9,196,723 B1 * | 11/2015 | Chen | H01L 29/0623 |
| 9,905,558 B1 | 2/2018 | Appaswamy et al. | |
| 9,905,687 B1 * | 2/2018 | Zhu | H01L 29/7801 |
| 10,249,610 B1 | 4/2019 | Appaswamy et al. | |
| 2005/0242371 A1 * | 11/2005 | Khemka | H01L 29/7835 |
| | | | 257/E27.032 |
| 2013/0001688 A1 * | 1/2013 | Verma | H01L 21/761 |
| | | | 257/E27.06 |
| 2013/0153956 A1 * | 6/2013 | Shi | H01L 21/743 |
| | | | 257/140 |
| 2015/0102384 A1 * | 4/2015 | Zhan | H01L 27/0248 |
| | | | 438/353 |
| 2019/0214497 A1 * | 7/2019 | Verma | H01L 29/66681 |
| 2021/0036152 A1 * | 2/2021 | Tsai | H01L 29/6656 |

\* cited by examiner

SILICIDE-BLOCK-RING BODY LAYOUT FOR NON-INTEGRATED BODY LDMOS AND LDMOS-BASED LATERAL IGBT

CROSS-REFERENCE TO RELATED APPLICATIONS

This application claims priority to U.S. Provisional Patent Application Ser. No. 63/043,199, filed on Jun. 24, 2020, which is incorporated herein by reference in its entirety.

TECHNICAL FIELD

This disclosure relates to the field of semiconductor devices, and more particularly, but not exclusively, to improved reliability and reduced size of transistor devices such as LDMOS and LDMOS-based IGBT.

BACKGROUND

An insulated-gate bipolar transistor (IGBT) is a three-terminal power semiconductor device primarily used as an electronic switch. It combines high efficiency and fast switching. IGBTs switch electric power in many modern appliances: variable-frequency drives (VFDs), electric cars, trains, variable speed refrigerators, lamp ballasts, air-conditioners, and even stereo systems with switching amplifiers, etc. Since it is designed to turn on and off rapidly, amplifiers that use it often synthesize complex waveforms with pulse-width modulation and low-pass filters. In switching applications, modern devices feature pulse repetition rates well into the ultrasonic range-frequencies which are at least ten times the highest audio frequency handled by the device when used as an analog audio amplifier.

The IGBT combines the simple gate-drive characteristics of a metal oxide semiconductor field effect transistor (MOSFET) with the high-current and low-saturation-voltage capability of a bipolar transistor. The IGBT combines an isolated-gate FET for the control input and a bipolar power transistor as a switch in a single device. Large IGBT modules typically include many devices in parallel and can have very high current-handling capabilities in the order of hundreds of amperes with blocking voltages of 6000 V. These IGBTs can control loads of hundreds of kilowatts.

Various structures for IGBTs, such as: planar IGBTs, trench IGBTs, and lateral IGBTs, have been designed to customize the operational properties of the device for particular applications. For example, planar or vertical IGBTs utilize a convenient structure for a high power (e.g., high voltage and high current) switch. The planar IGBT includes a collector at a bottom side, a gate at a top side, and an emitter surrounding the gate at the top side. Trench gate IGBTs have a similar general structure to the planar IGBTs. However, trench IGBTs include a trench within which the gate is situated. The trench reduces the on-state voltage drop of the device. The current path of planar and trench IGBTs is vertical from the collector to the emitter.

Lateral IGBTs (LIGBT) are often employed in lower power control and detection circuits. Lateral IGBTs do not utilize the vertical structure of the planar and trench IGBTs, where collector and emitter contacts are provided on the top and on the bottom of the semiconductor material. Instead, lateral IGBTs generally include a substrate contact at a bottom side, a collector at one side of a top side, an emitter at the other side of the top side, and a gate disposed between the emitter and the collector at the top side. The current path of lateral IGBTs is horizontal (e.g., lateral) within the device from the collector to the emitter.

SUMMARY

Some examples provide semiconductor devices, and methods of making such devices. In one example an integrated circuit includes a semiconductor substrate having a doped region with a first conductivity type. A source region is located within the doped region, the source region having a second opposite conductivity type. A drain region having the second conductivity type is spaced apart from the source region. A gate electrode is located between the source region and the drain region, the gate electrode partially overlapping the doped region. A body region having the first conductivity type is located within the doped region. A dielectric layer forms a closed path around the body region.

Other examples provide one or more methods of implementing the previously described examples.

BRIEF DESCRIPTION OF THE DRAWINGS

For a detailed description of various examples, reference will now be made to the accompanying drawings in which.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Toward a goal of increasing current efficiency and safe operating area (SOA) in some transistor devices, some examples of the present disclosure reduce the body resistance of such transistors by reducing the distance between the body and the source. The reduction is made possible by providing a new configuration of a dielectric layer used to conductively isolate the body from the source at a surface of the substrate in which the transistor is implemented. In such a configuration the dielectric layer forms closed loops, each closed loop enclosing a corresponding body region. Source regions, and metal contacts to the source regions, are located between nearest-neighbor body regions. While such configurations may increase current efficiency and SOA, no particular result is a requirement of the present invention unless explicitly recited in a particular claim.

While the described examples include specific combinations of N-type regions and P-type regions, those skilled in the art will appreciate that the conductivity types of the various doped regions may be reversed to form analogous examples that fall within the scope of the disclosure.

Figure 1:
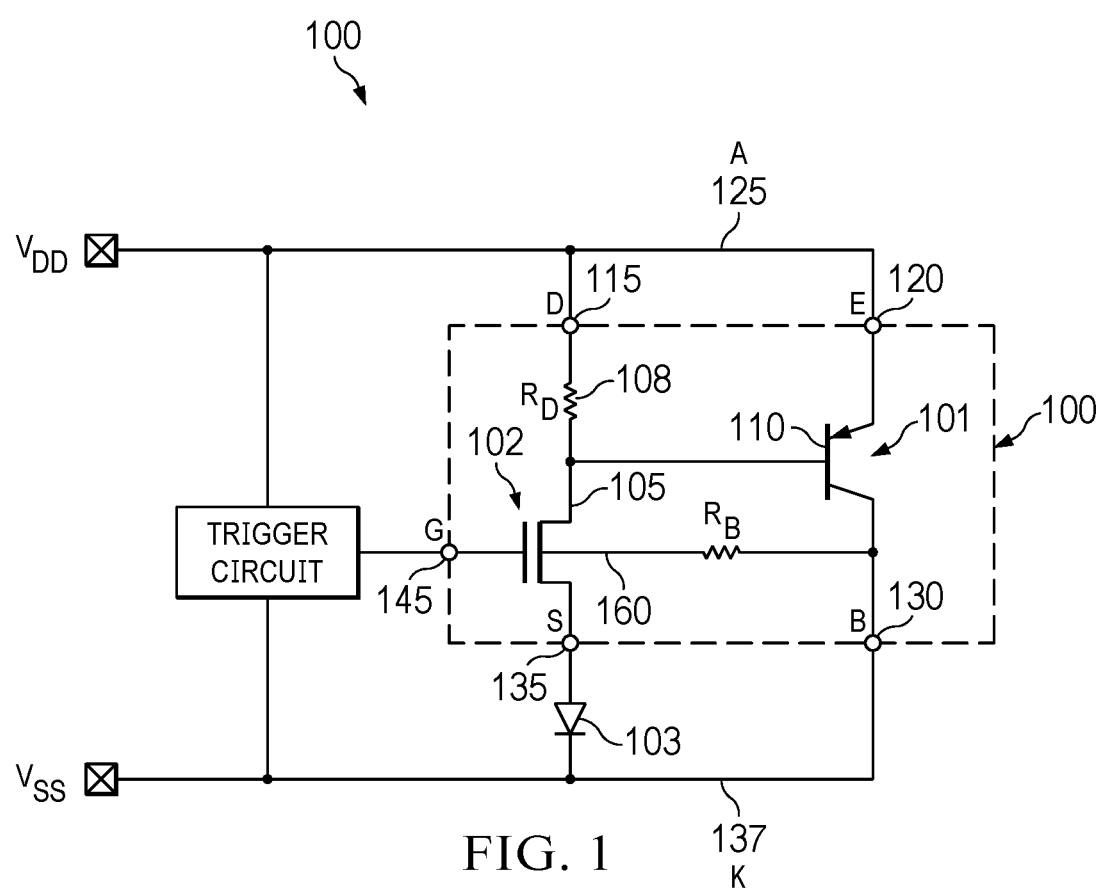
FIG. 1 illustrates an equivalent circuit schematic for a lateral IGBT, including a bipolar transistor and a MOS transistor.

FIG. 1 illustrates an equivalent circuit schematic of an integrated circuit (IC), including an electronic device 100. Without implied limitation, the IC may be designed to control power between a source and a load, or similar applications. The electronic device 100 is sometimes referred to herein without implied limitation as an insulated-gate bipolar transistor (IGBT). The device 100 includes a bipolar junction transistor (BJT) 101 and an extended drain (ED) MOSFET 102. A drain terminal 105 of the MOSFET 102 is connected to a base 110 of the BJT 101. An extended drain terminal 115 of the MOSFET 102 and an emitter 120 of the BJT 101 are connected at an anode (A) 125 of the device 100. In a nonlimiting configuration, a diode 103 is connected between a collector 130 of the BJT 101 and a source 135 of the MOSFET 102, with the node between the collector 130 and the diode 103 serving as a cathode (K) 137. A resistor 108 represents a resistance RD associated with an extended drain of the MOSFET 102, and a resistor RB represents a resistance associated with a body resistance between a body 160 of the MOSFET 102 and the collector 130. A gate 145 provides a control terminal to place the device 100 in a conduction state between the anode 125 and the cathode 137, or in a high-impedance state.

Figure 2:
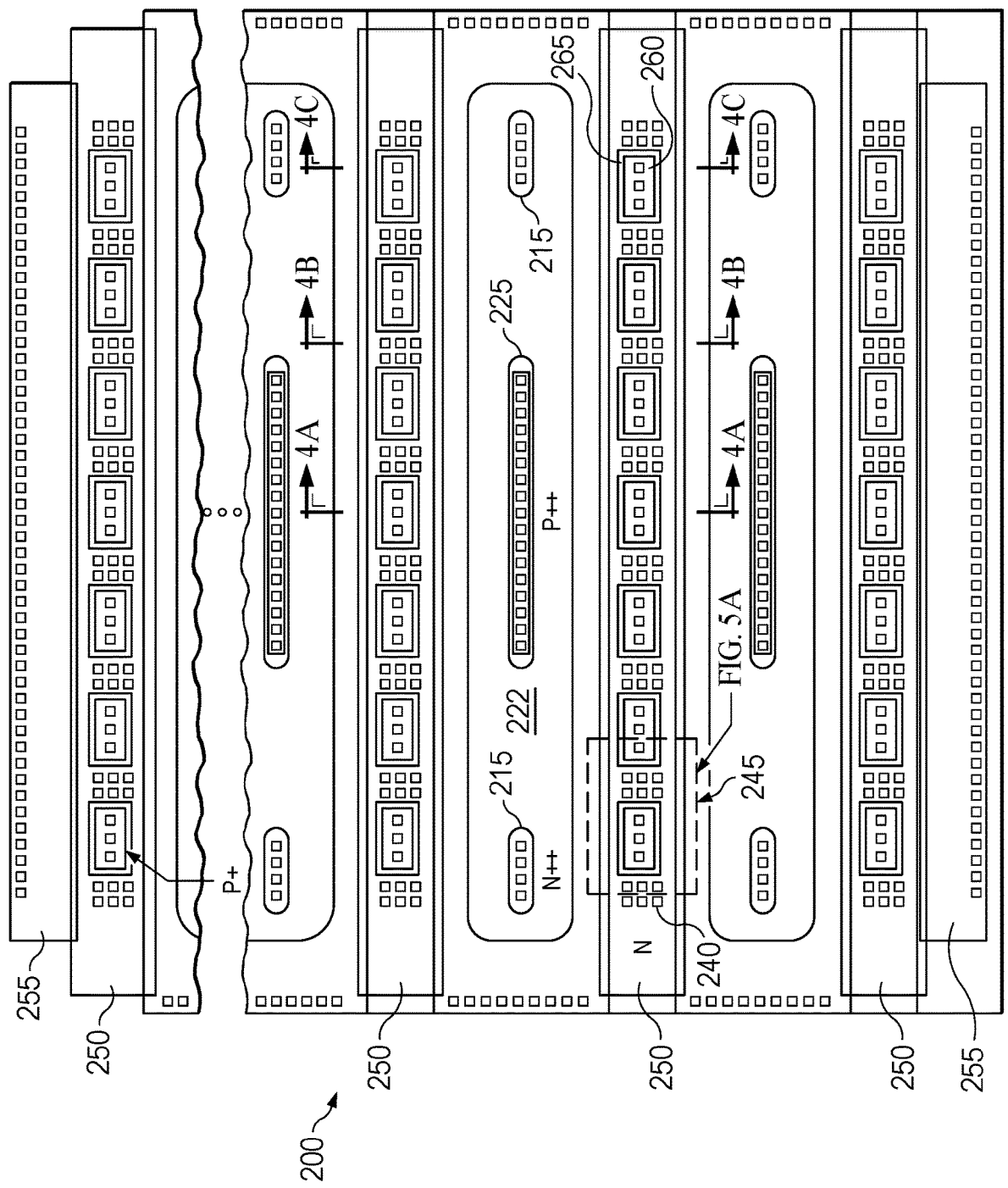
FIG. 2 illustrates a lateral IGBT according to one example of the disclosure.

FIG. 2 presents a plan view of an electronic device 200 that may implement the device 100 according to various examples of the disclosure. The device 200 may be referred to without implied limitation as a transistor 200, while recognizing that more than one transistor may operate within the device 200. The example transistor 200 may be described as a multi-finger transistor, in which N gate electrodes 245, three in the present example, may be considered as fingers of the device. The source 135 is implemented by N+1 source regions 250, sometimes collectively referred to as the source 250. An instance of the gate electrode 245, sometimes referred to herein simply as a gate 245, is located between nearest-neighbor instances of the source regions 250. A drain region 215 corresponding to the extended drain terminal 115 is accessed through two openings in each of LOCOS layers 222, and an emitter region 225 is accessed through a single opening in each LOCOS layer 222 between the drain region 215 openings. In some other examples, shallow-trench isolation (STI) structures may be used in lieu of the LOCOS layers 222. The drain region 215 is physically implemented with an $N^+$ region that may be referred to equivalently as a drain 215. The gate 245 partially overlaps nearest-neighbor instances of the source region 250. Optional dummy gates 255 spaced apart from first and last instances of the gates 245 may be included to improve manufacturing uniformity of features within the area circumscribed by the source regions 250. Various metal vias, generally referred to as contacts 240, provide conductive connections to the various structures of the transistor 200.

Between the gates 245 are located a number of body regions 260, collectively referred to as the body region 260. A corresponding dielectric structure 265 encloses, surrounds, or circumscribes each body region 260. A silicide layer, not explicitly shown, overlies the source regions 250 and the body regions 260, e.g. to provide an ohmic connection between a metal contact and the underlying semiconductor. The dielectric structures 265 prevent formation of the silicide layer at their locations, thus ensuring the body regions 260 are not directly conductively connected to the source regions 250. This property of the dielectric structures 265 is sometimes referred to in the art as "silicide blocking", sometimes shortened to "SiBLK". As such the dielectric structures 265 may be equivalently referred to herein as SiBLK 265.

Figure 3A:
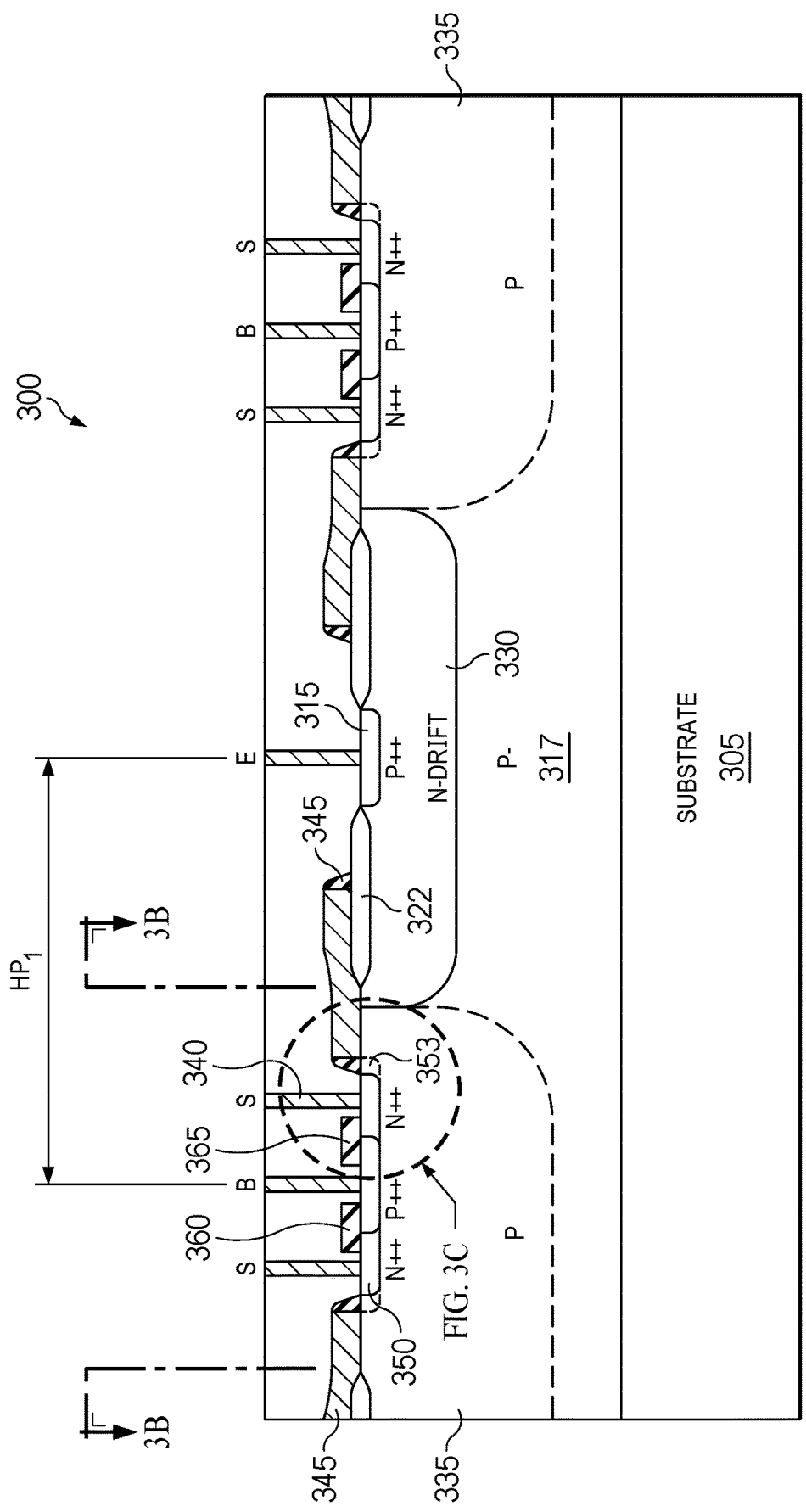
FIGS. 3A-3C illustrate a portion of a baseline IGBT that includes parallel SiBLK structures, each SiBLK structure located between a body region and a source region, including a resistance between the body region and a channel region.

FIG. 3A shows a section view of a baseline transistor 300 that is similar to the transistor 200, but differs in certain respects as described below. A substrate 305 supports a layer 317, such as a lightly-doped epitaxial layer, having a first conductivity type, or P-type. A drift region 330 is located between two P-type double-diffused wells, or DWELLs, 335. Body regions 360, each located between two source regions 350, are located in each DWELL 335. A drain region 315 having a second conductivity type, or N-type, may act as an anode when connected to a $P^+$ emitter contact (not shown), and is located within the drift region 330. A LOCOS 322 structure surrounds the drain region 315. A gate electrode 345 extends from the drain region 315 to a source region 350 in each of the DWELLs 335, and surrounds the drain region 315. Unreferenced metal contacts provide vertical connections to the source regions 350, body regions 360 and drain region 315. In particular, a contact 340 to the source region 350 is discussed in greater detail below. An SiBLK layer 365, sometimes referred to as SiBLK 365, is located over each junction formed between one of the body regions 360 and one of the source regions 350.

Figure 3B:
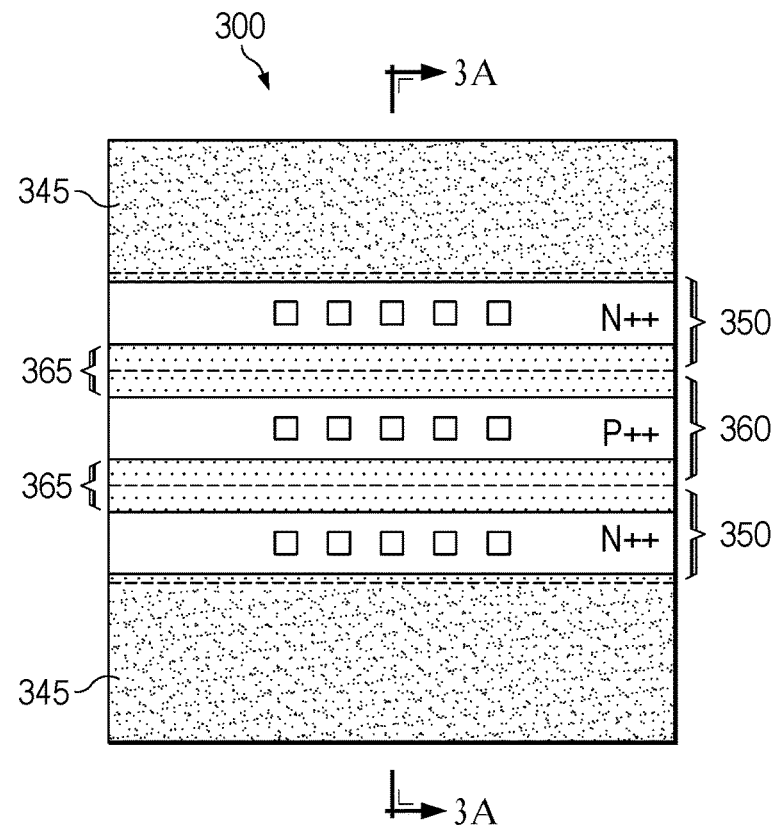

FIG. 3B illustrates a plan view of a portion of the transistor 300 taken between the gate electrode 345 and an adjacent gate electrode 345 as marked in FIG. 3A. The illustrated view includes one body region 360 between two source regions 350. An optional source extension 353 extends from each of the source regions 350 under unreferenced dielectric spacers on sidewalls of the gate electrodes. The body region 360 and the two source regions 350 are arranged as parallel stripes. SiBLK 365 lines, also arranged as parallel stripes, overlie the junctions between the body region 360 and the source regions 350. This configuration is representative of some baseline IGBT transistors that have a greater body resistance than desired.

Figure 3C:
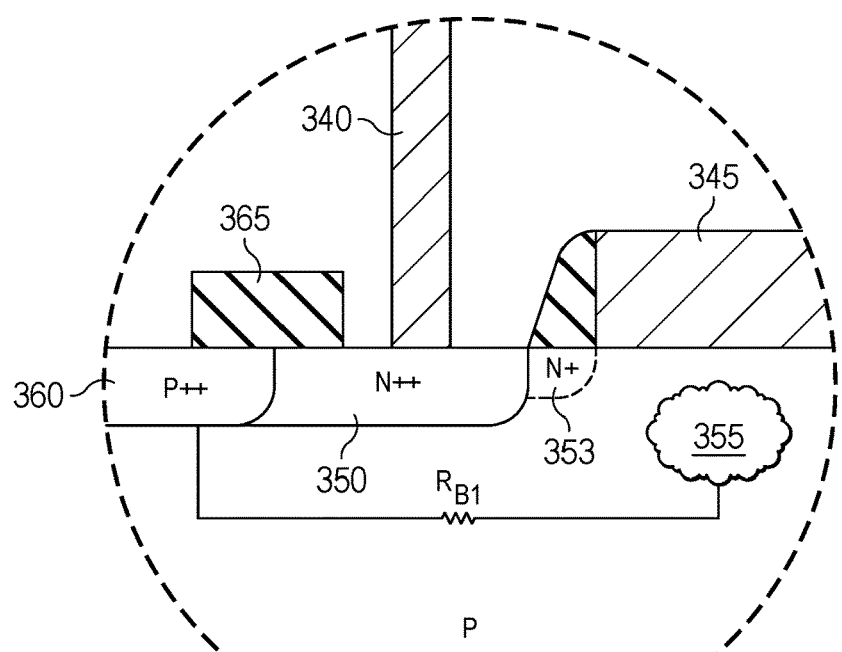

Focusing on the vicinity of the source region 350, FIG. 3C illustrates a body resistance $R_{B1}$ between the body region 360 and a channel region 355 under the gate electrode 345. The value of $R_{B1}$ is in part a function of the width of the source region 350 that spaces the body region 360 apart from the channel region 355. The width of the source region 350 in turn depends in part on the presence of the contact 340. The source region 350 width must accommodate the width of the contact 340. But also, because technology design rules enforce minimum spacing between the contact 340 and the SiBLK 365, and between the contact 340 and the gate electrode 345, the minimum width of the source region 350 must also accommodate such requirements. Thus the value of $R_{B1}$ cannot be reduced below a lower limit determined by such factors.

The value of the body resistance generally impacts device performance by allowing a parasitic NPN transistor formed by the source region 350, the DWELL 335 and the drain region 315 to trigger at a lower voltage, thus reducing the safe operating area (SOA) of the transistor. Furthermore, the width of the source region 350 needed to accommodate the contact 340 results in a larger half-pitch of the transistor, represented by $HP_1$ in FIG. 2A. The larger half-pitch increases die area of the substrate on which the transistor is formed.

Figure 4A:
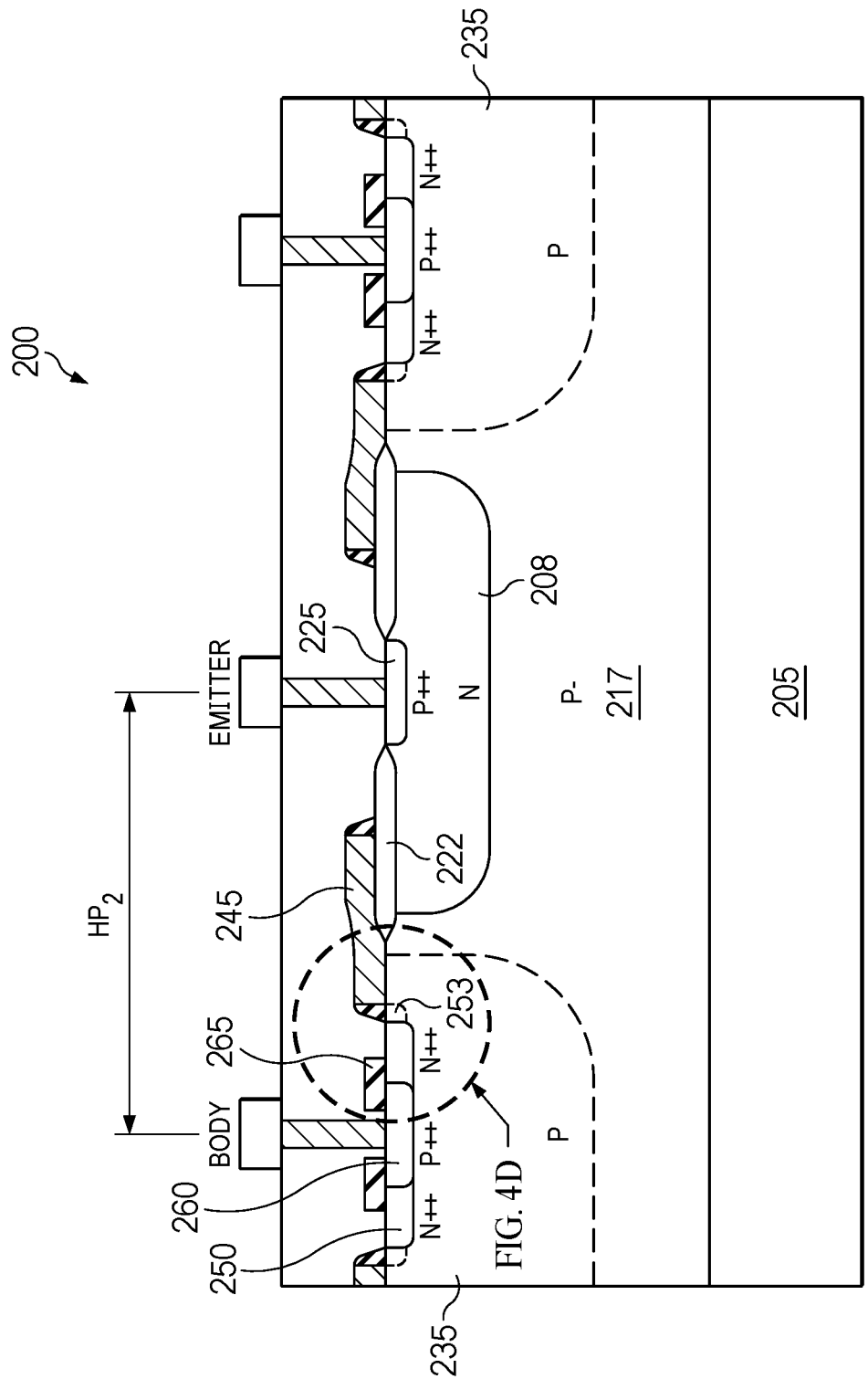
FIGS. 4A-4D illustrate a portion of an example IGBT of the disclosure that includes parallel closed-loop SiBLK structures, each SiBLK structure circumscribing a body region, being separated from a neighboring SiBLK structure by a source region, and being located between two adjacent gate electrodes, including a smaller resistance between the body region and a channel region.
Figure 4B:
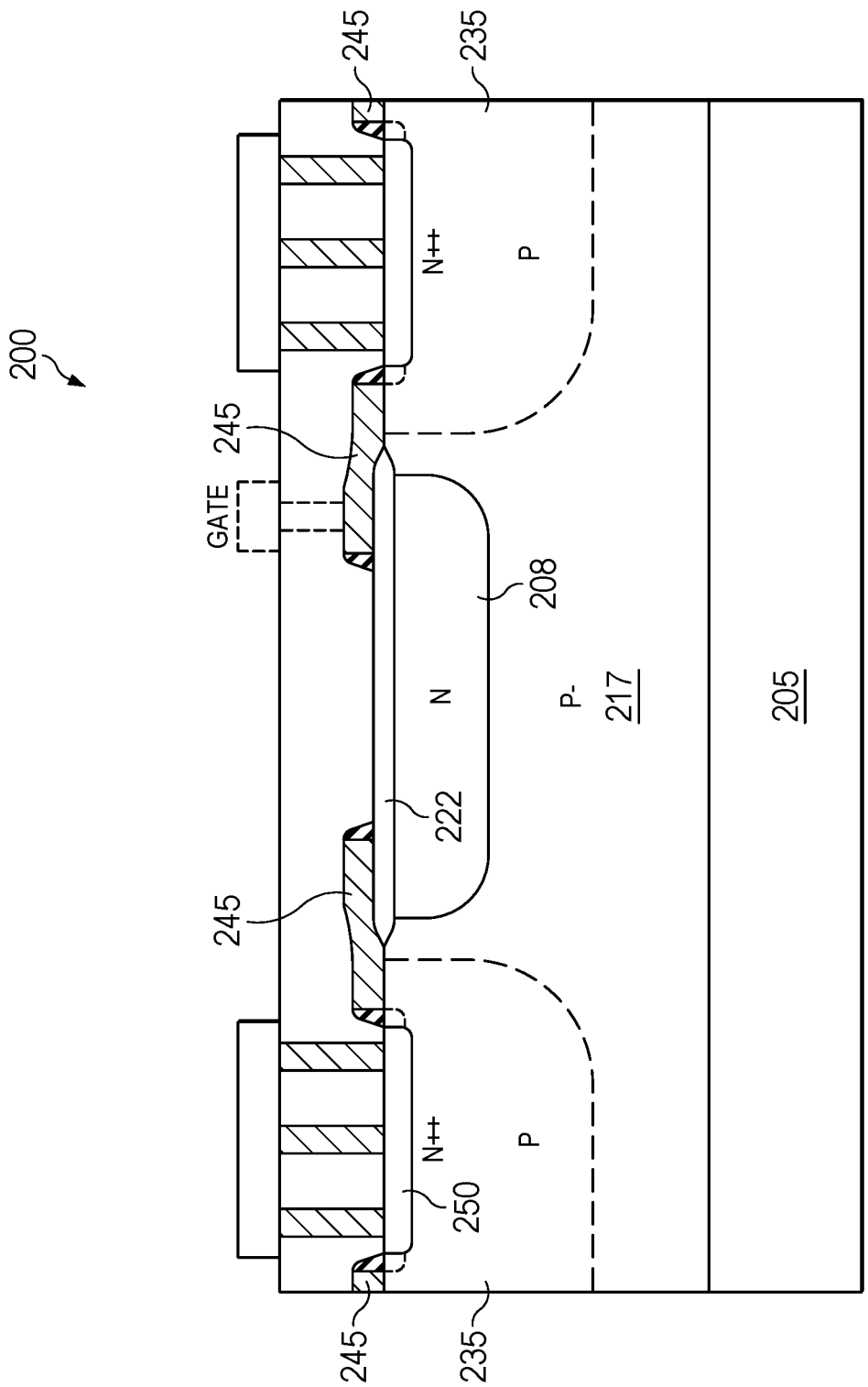
Figure 4C:
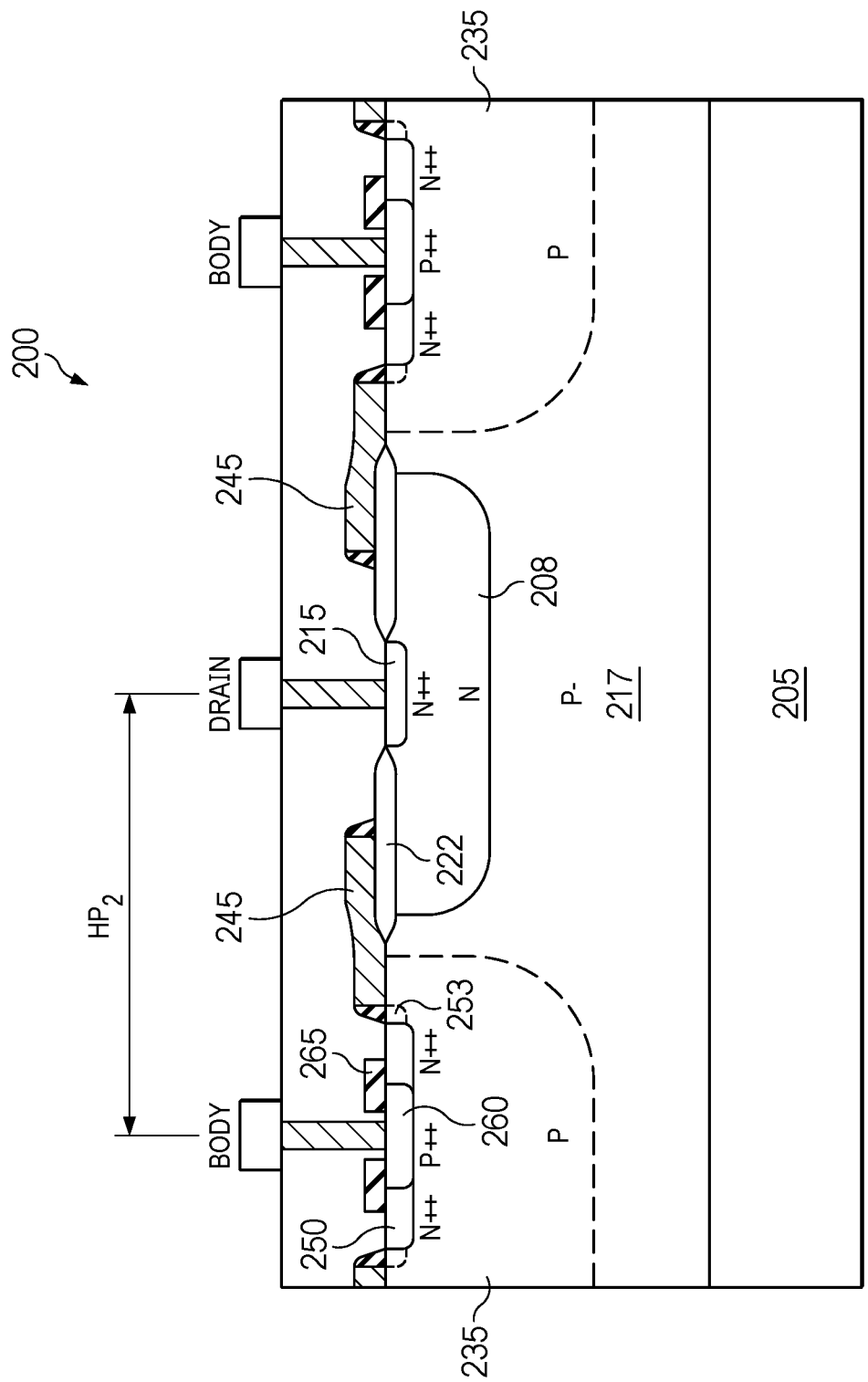

Returning to FIG. 2, the transistor 200 addresses some deficiencies of the baseline transistor 300 by segmenting the body into the body regions 260, and placing contacts to the source regions 250 between the body regions 260, allowing the body regions to be located closer to the channel regions of the transistor 200. FIGS. 4A-4C present three cut locations as marked in FIG. 2 to further illustrate this aspect of the transistor 200.

Figure 4D:
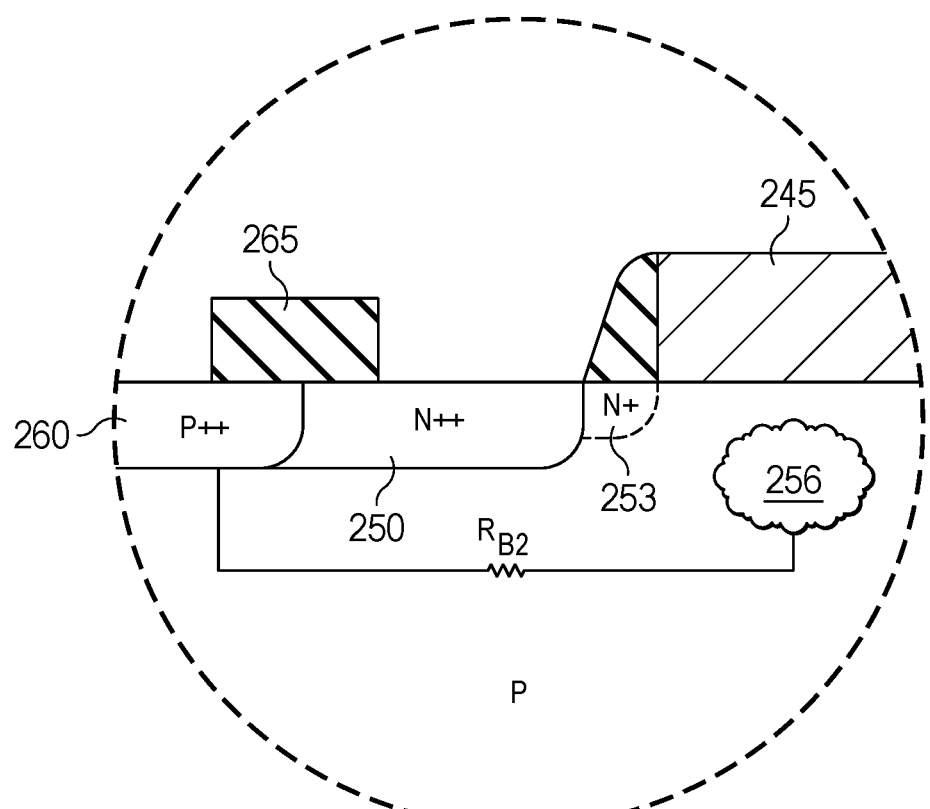

FIG. 4A shows a section view through the emitter region 225 of the transistor 200 and neighboring instances of the body region 260. A P-type layer 217, e.g. a lightly-doped epitaxial layer, overlies a substrate 205. The emitter region 225 is located within an N-drift region 208 that in turn is located within the layer 217. The source regions 250 and body regions 260 are located within DWELLs 235. Source extensions 253 extend from each source region 250 under unreferenced dielectric spacers on the sidewalls of the gate electrodes 245. The source extensions 253 are described in greater detail below. A detail view in FIG. 4D shows salient features of the source region 250, one instance of the body region 260, and one instance of a gate 245. A body resistance value $R_{B2}$ characterizes the resistance between the body region 260 and a channel region 256 under the gate 245. The value of $R_{B2}$ is determined in part by the width of the source region 250, which now neither includes the width of the contact 340 (FIG. 3C), nor the minimum spacing rules associated with the contact 340. Because the width of the source region 250 (FIG. 4D) is lower than the width of the source region 350 (FIG. 3C), the value of $R_{B2}$ is less than the value of $R_{B1}$, resulting in improved SOA. Moreover, because the width of the source region 250 is less than the width of the source region 350, a half-pitch of the transistor 200, represented by $HP_2$, is less than the half-pitch $HP_1$ of the transistor 300 (FIG. 3A), resulting in smaller die area needed to implement the transistor 200 relative to the baseline transistor. (The half-pitch of the transistor 200 may be determined by N multiples of HP1 (FIG. 3A) plus additional width related to the dummy gates 255, if present.)

FIG. 4B illustrates another sectional view of the transistor 200, taken through the gate 245 and two adjacent source regions 250. The distance between neighboring gates 245 may be determined at least in part by the minimum dimensions and spacing of the body region 260 (including contacts), and the width of the SiBLK 265 (FIG. 4A). The number of contacts to the source region 250 between the gates 245, shown as three in the example of FIG. 4B, may be determined by design rule constraints regarding contact width and spacing in the available gap between the adjacent gates 245. For completeness, FIG. 4C illustrates another sectional view of the transistor 200, taken through the drain region 215 and an instance of the body region 260. Unreferenced metal contacts to the body regions 260 are circumscribed by the SiBLK 265, as seen more clearly in FIG. 1A.

Figure 5A:
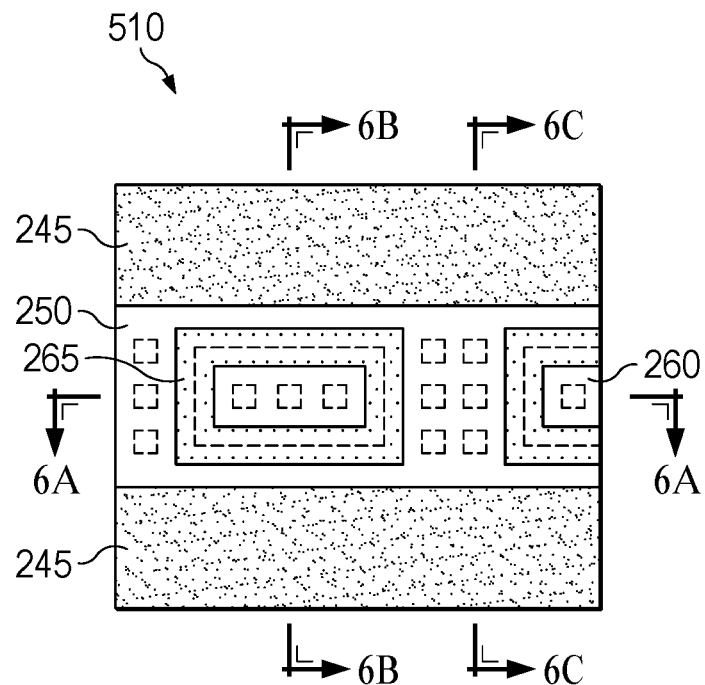
FIG. 5A-5D illustrate various examples of SiBLK structures that each form a closed path around a corresponding body region.
Figure 5B:
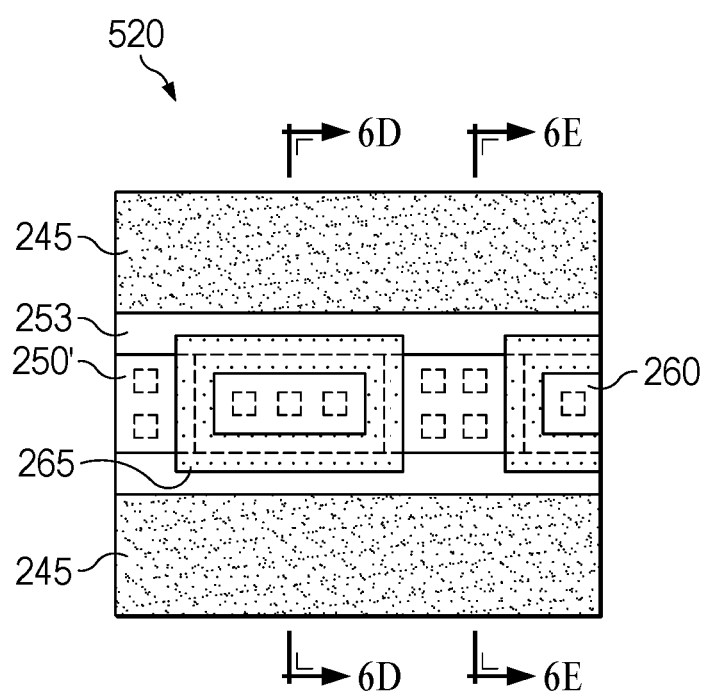
Figure 5C:
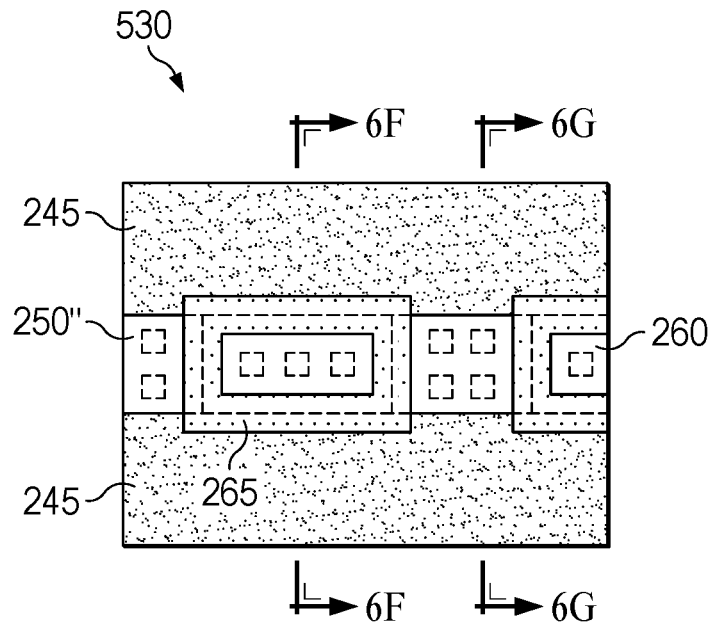
Figure 5D:
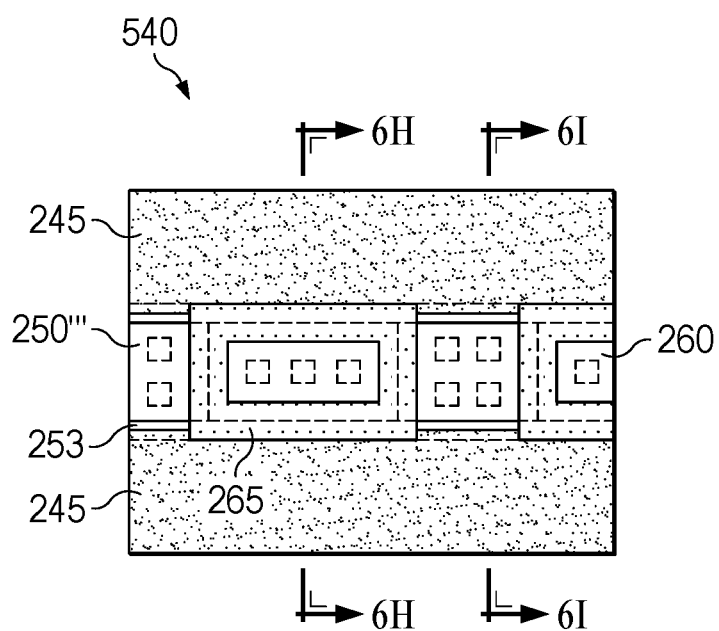

FIGS. 5A 5D illustrate various configurations of the body region 260, the SiBLK 265, and adjacent gates 245. FIGS. 6A-6I provide illustrative cross-sections of indicated locations in FIGS. 5A-5D. FIGS. 6A-6I are presented with a larger horizontal scaling than that of FIGS. 5A-5D to better show some structural details of these examples.

FIG. 5A shows for reference the configuration previously illustrated in FIG. 2, now designated configuration 510. The body regions 260 in the illustrated example have a rectangular shape. More generally the body regions have sides that are parallel to the edges of the gates 245, with those parallel sides being joined by ends that may have any outline, e.g. straight or rounded. In some examples the body regions have a quadrilateral shape with 90° corners, such as a square or rectangle, but could in principle be trapezoidal, or be parallelograms with corners being other than 90°. The remaining discussion assumes without implied limitation that the body regions 260 are rectangular.

Figure 6A:
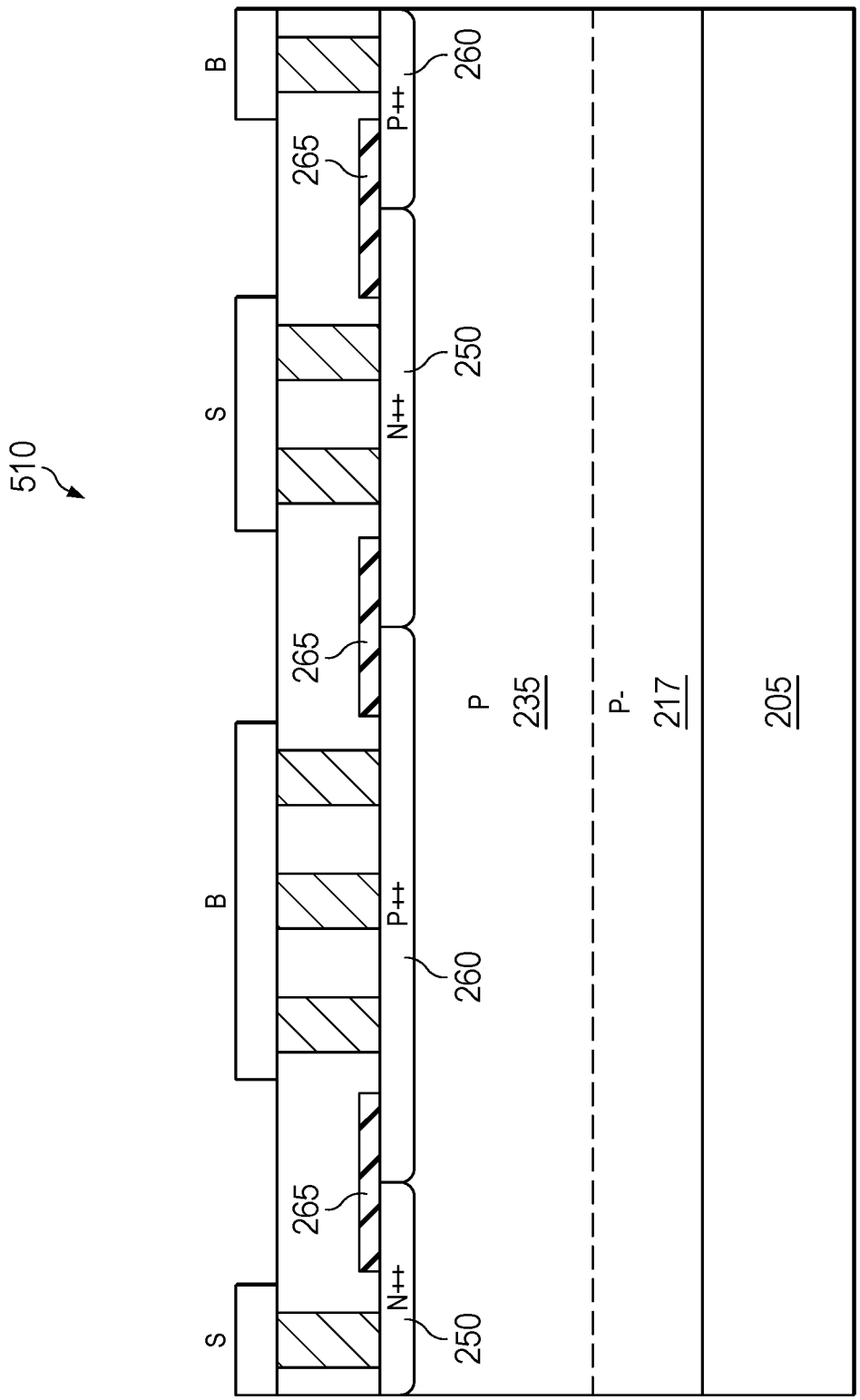
FIGS. 6A-6C illustrate section views through different locations of the example of FIG. 5A.
Figure 6B:
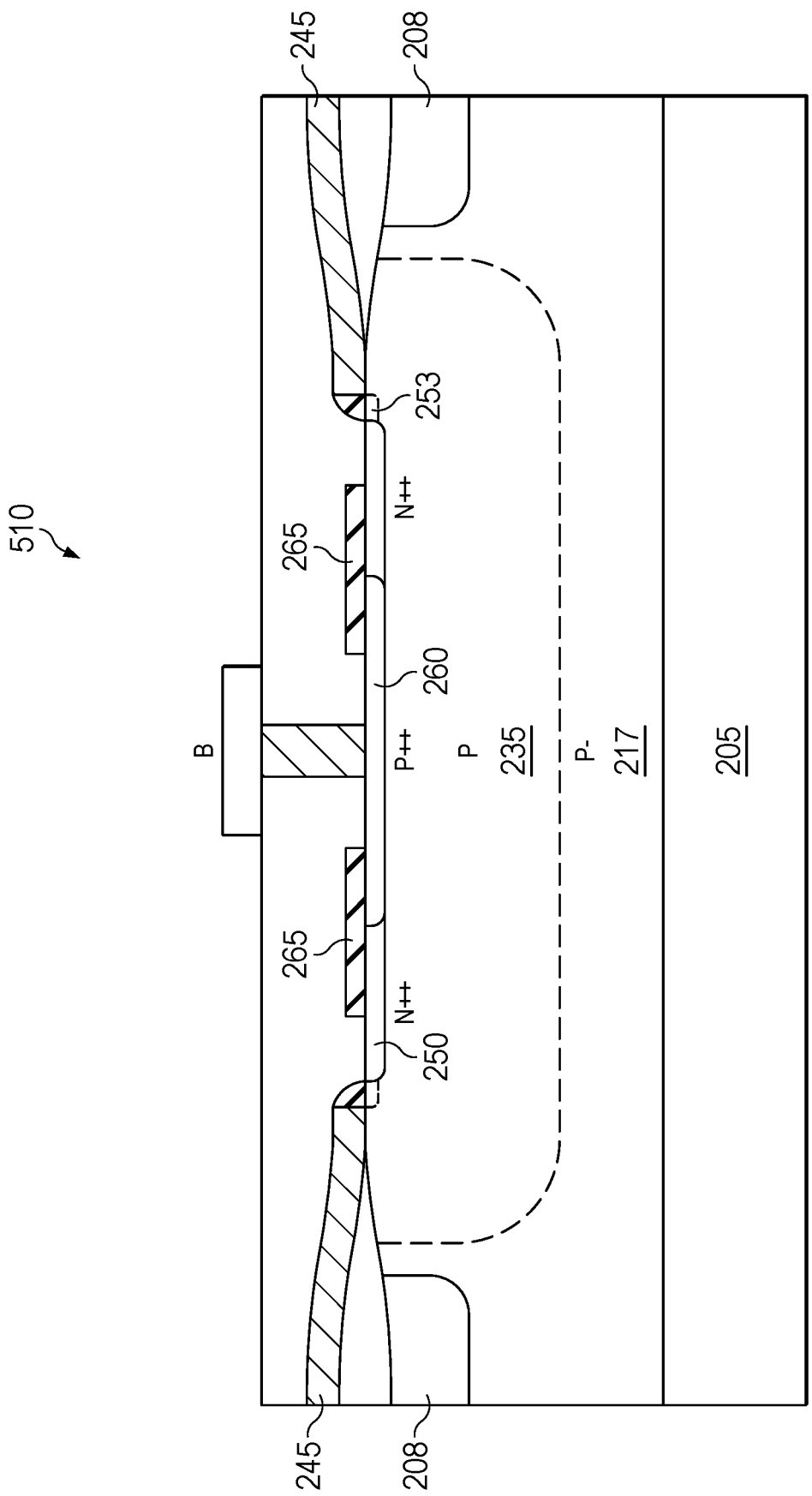
Figure 6C:
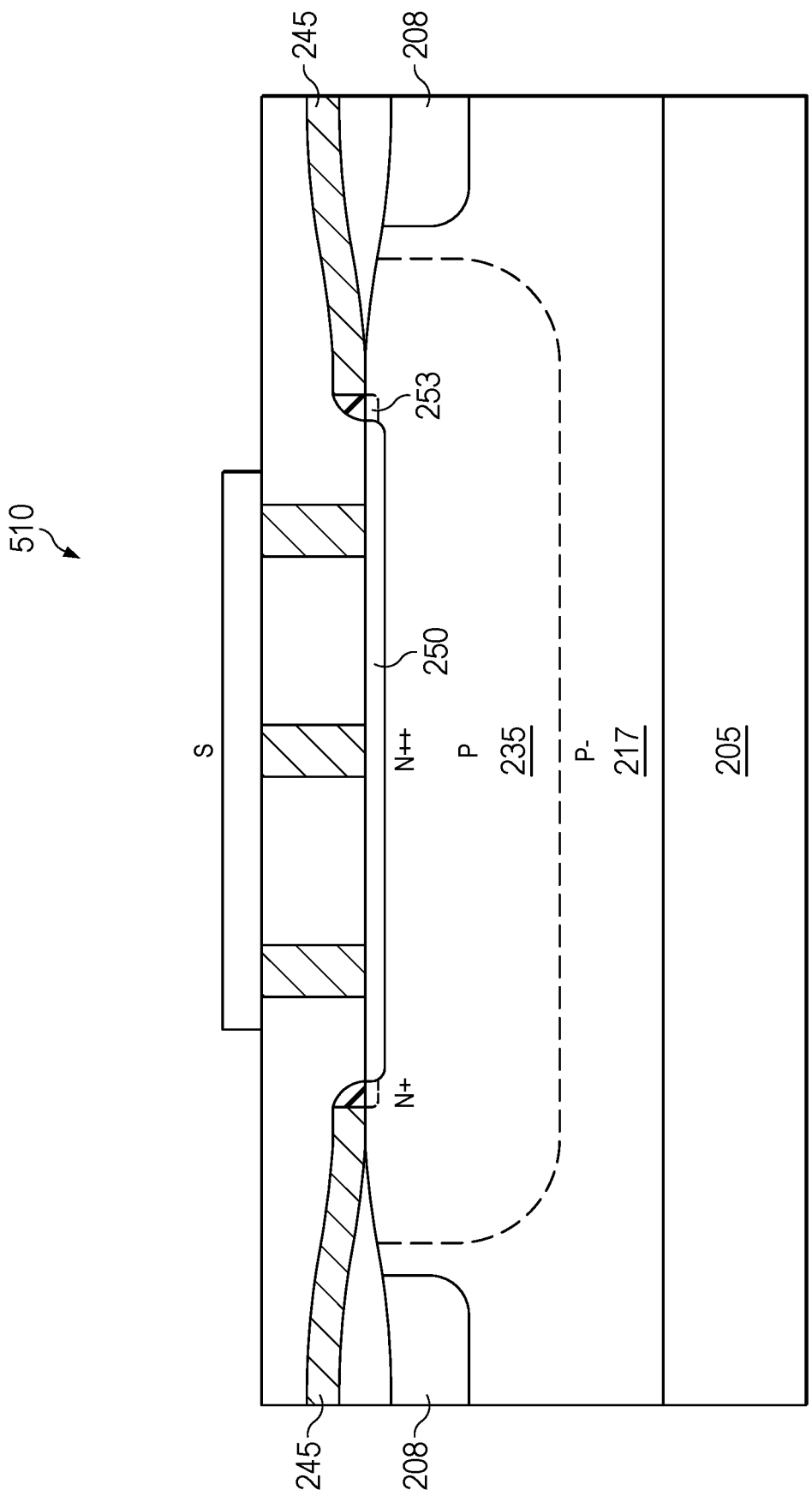

FIG. 6A shows a section view taken along the long axis of the source region 250 and through the body regions 260, while FIG. 6B shows a section view perpendicular to the view of FIG. 6A, through the body region 260. FIG. 6B is analogous to FIG. 4A, but centered on the body region 260. FIG. 6A illustrates the alternate P+ doping of the body regions 260 touching the N+ doping of the source region 250. Sections of the SiBLK 265, which surround the body regions 260, are shown located over the junction formed between the body regions 260 and the source region 250. FIG. 6B shows a section view viewed at the body region 260, and FIG. 6C shows a section view viewed at the source region 250. In both of these views the DWELL 235 and the source region 250 both extend under the gates 245. The body region 260 and the SiBLK 265 are present in FIG. 6B and absent in FIG. C.

Figure 6D:
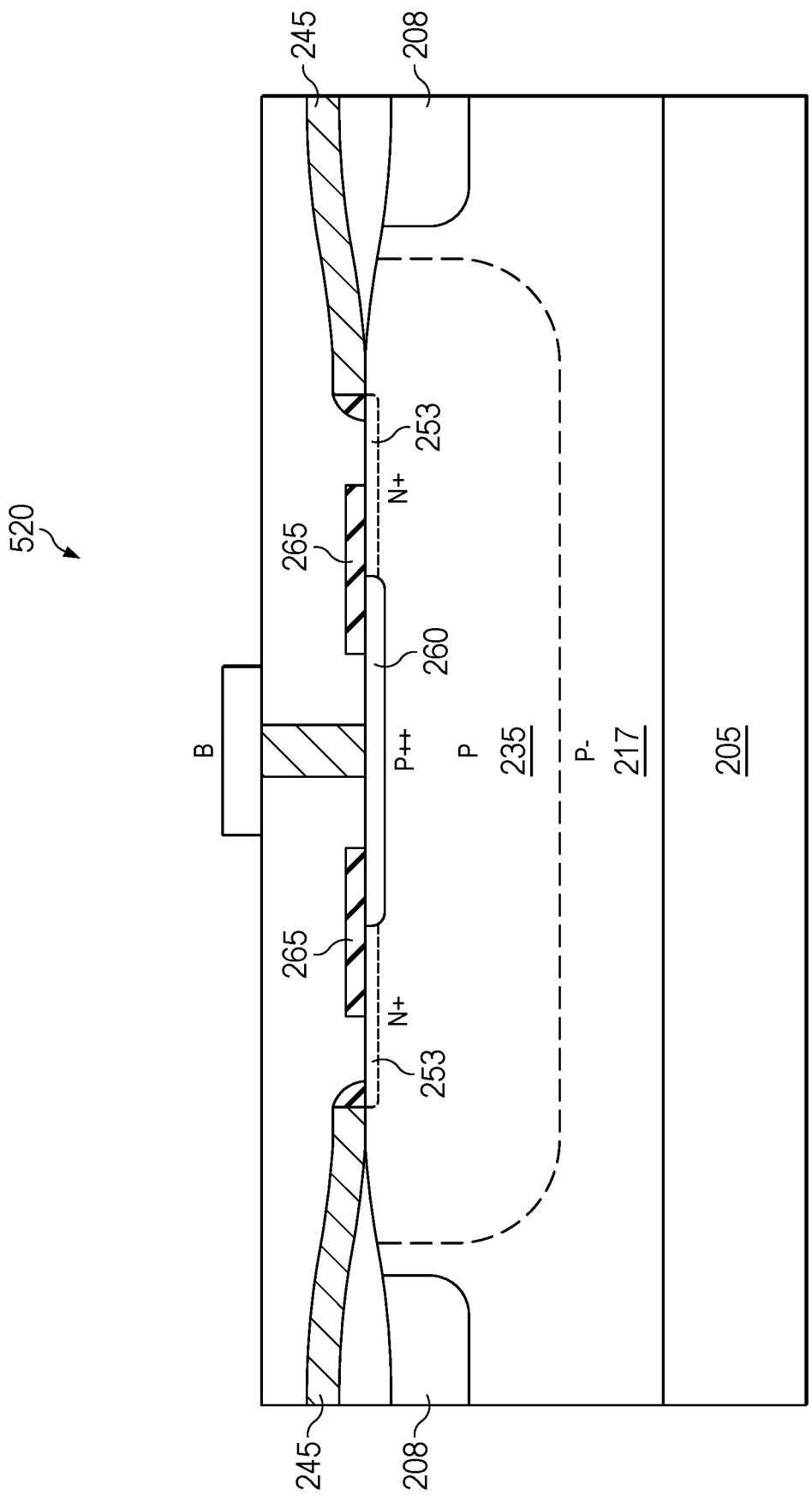
FIGS. 6D-6E illustrate section views through different locations of the example of FIG. 5B.
Figure 6E:
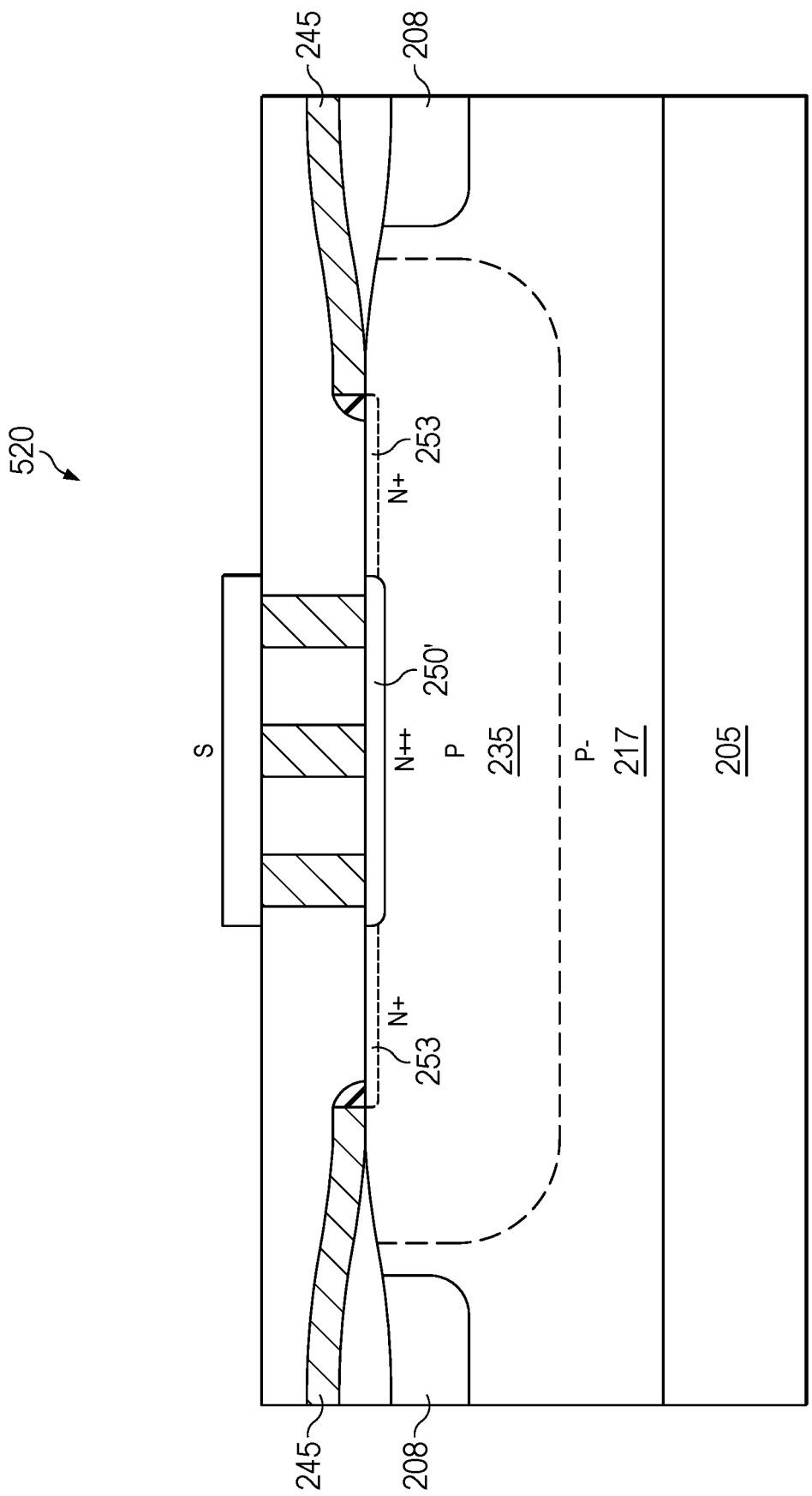

FIG. 5B shows an example configuration 520 in which a source region 250' has a width equal to the width of the body region 260, with source extensions 253 extending between the source regions 250' and the gates 245. FIG. 6D illustrates a section view through the body region 260, while FIG. 6E illustrates a section view through the source region 250'. As compared to the configuration 510, the configuration 520 spaces the source region 250' apart from the gate 245 such that the P-type layer 217 intersects the surface between the gate 245 and the source region 250'.

Figure 6F:
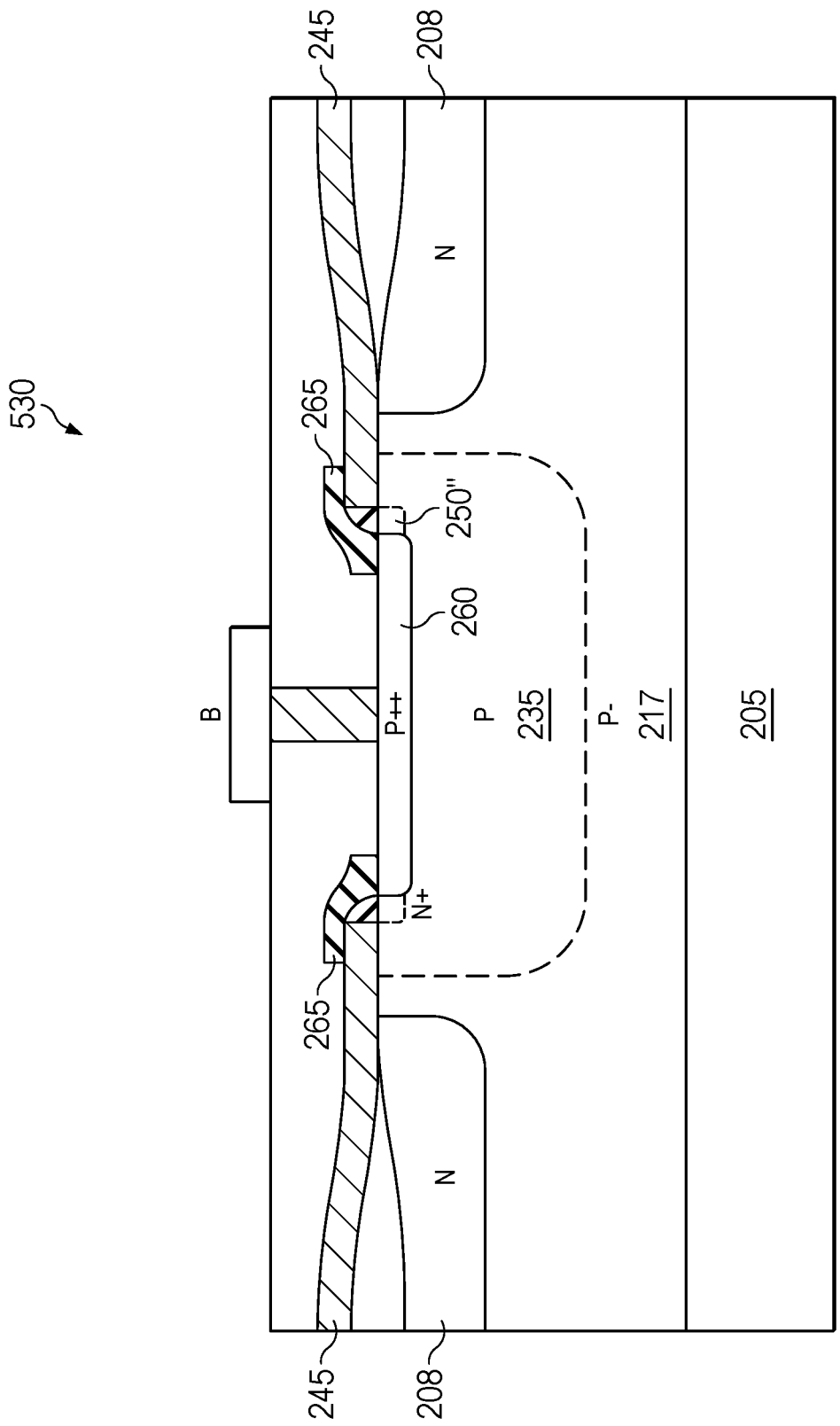
FIGS. 6F-6G illustrate section views through different locations of the example of FIG. 5C.
Figure 6G:
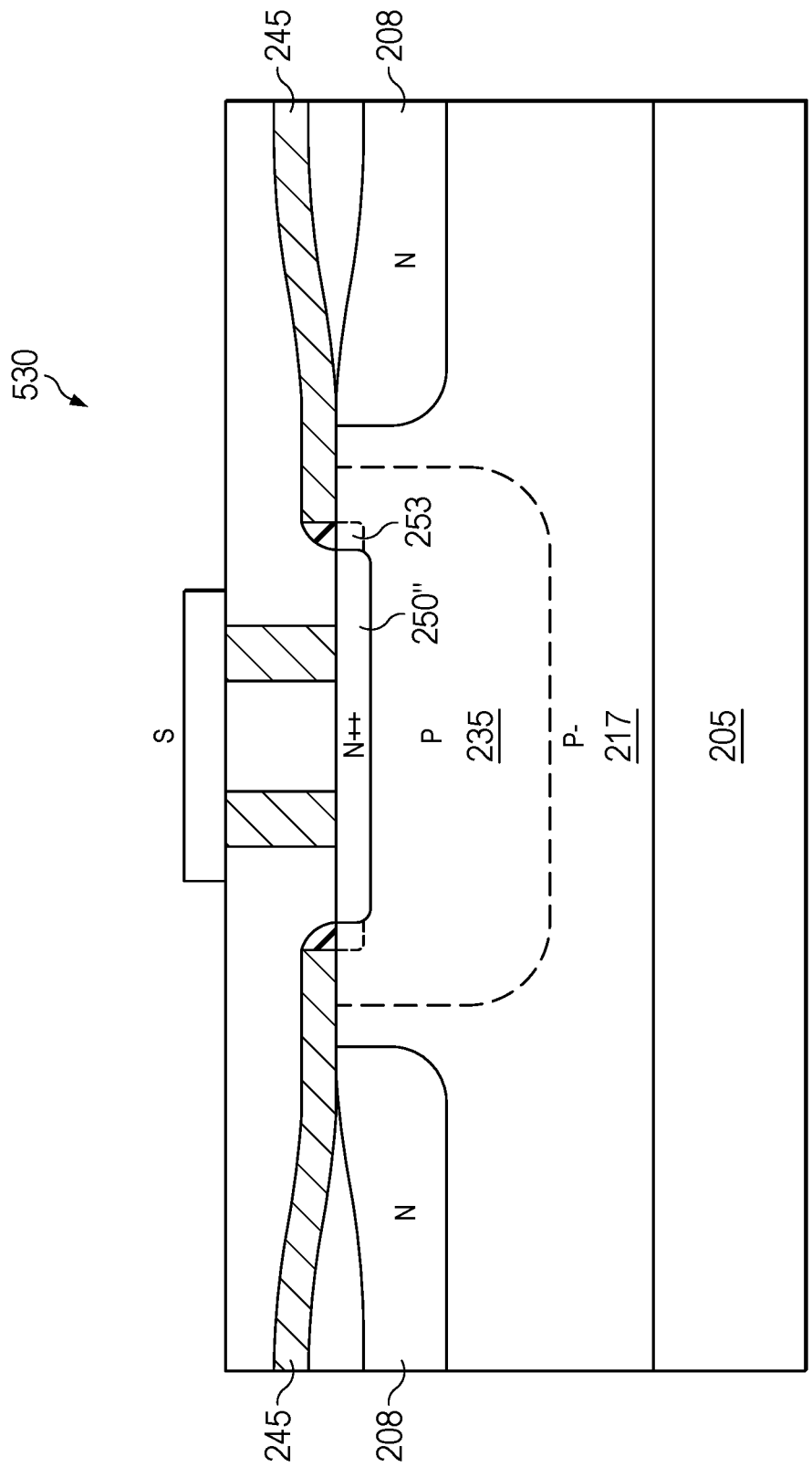

FIG. 5C shows an example configuration 530 in which the distance between the gates 245 is reduced relative to the configuration 510. A source region 250" is wider than the body region 260, and extends under the gates 245. FIG. 6F illustrates a section view through the body region 260, while FIG. 6G illustrates a section view through the source region 250". The body region 260 has the same width relative to the configuration 510, resulting in the spacing between the body region 260 and the gates to be reduced. Further, the SiBLK 265 overlaps the gates 245. Thus the configuration 530 has a half-pitch smaller than that of the configurations 510, 520.

Figure 6H:
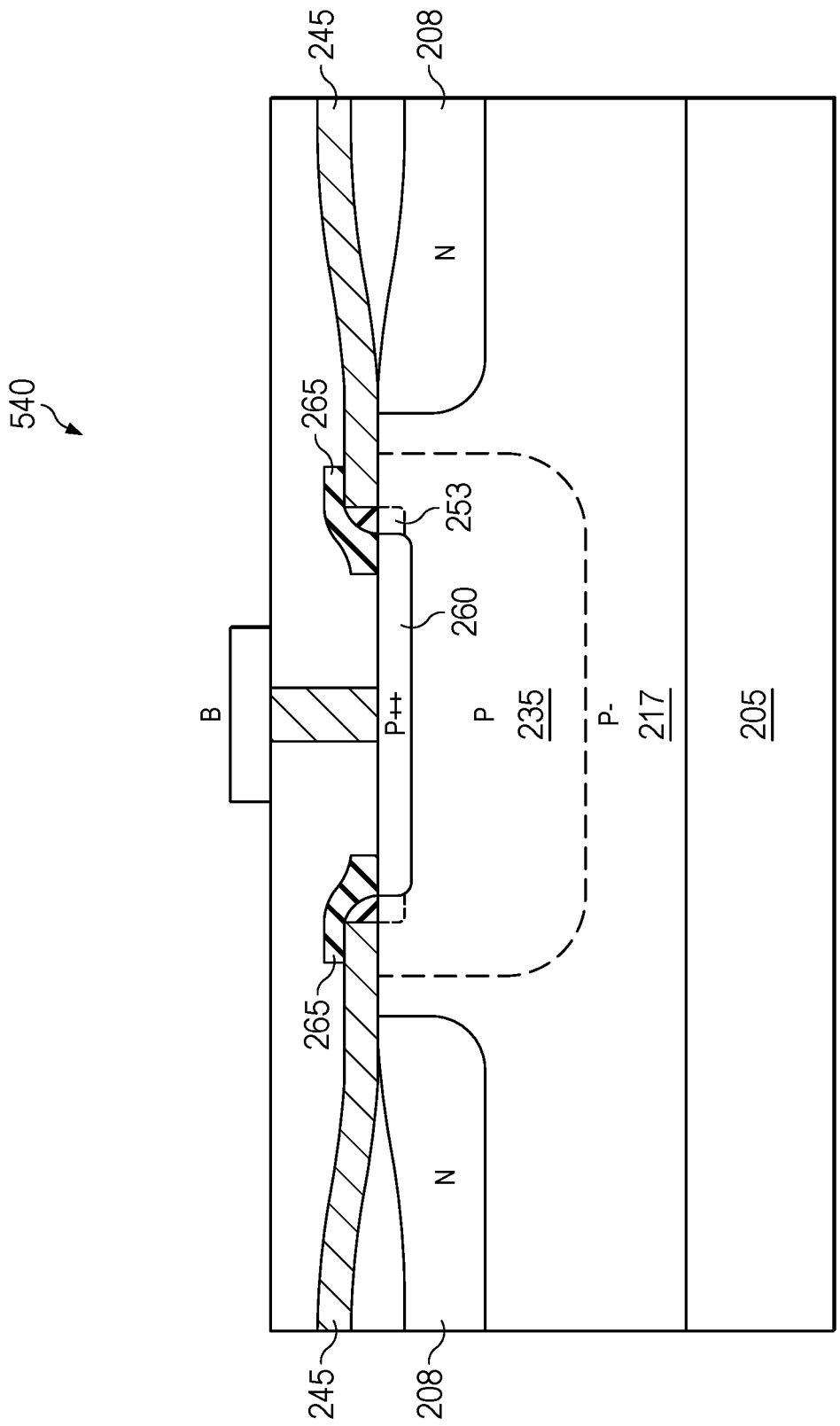
FIGS. 6H-6I illustrate section views through different locations of the example of FIG. 5D.
Figure 6I:
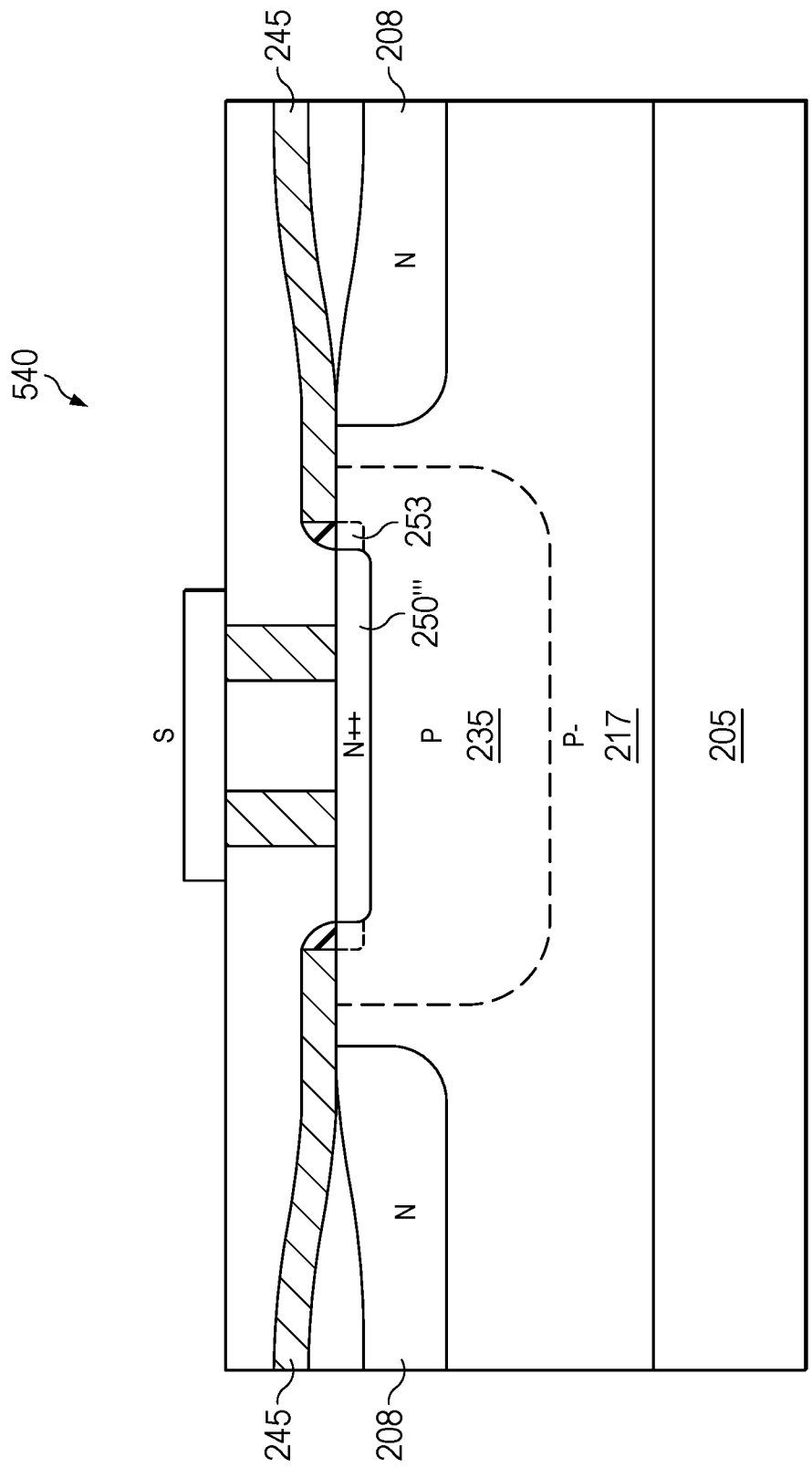

Finally FIG. 5D shows an example configuration 540 that is similar to the configuration 530 in that the distance between the gates 245 is reduced relative to the configurations 510 and 520. The configuration 540 is also similar to the configuration 520 in that a source region 250''' has the same width as the body region 260, with source extensions 253 extending between the source regions 250''' and the gates 245. FIG. 6H illustrates a section view through the body region 260, while FIG. 6I illustrates a section view through the source region 250'''. Thus the distance between the body region 260 and the gate 245 is again reduced relative to the configuration 510. And similar to the configuration 520, portions of the layer 217 intersect the substrate surface between the source region 250''' and the gates 245. The configuration 540 has the same half-pitch as does the configuration 530.

Table I displays relevant dimensional attributes of a representative baseline configuration characterized by FIGS. 3A and 3B, and example configurations of the disclosure characterized by FIGS. 5A and 5B, and FIGS. 5C and 5D. In these examples, presented without implied limitation, the spacing from the body region 260 to the gates 245 is about 0.375 µm for the examples of FIGS. 5A and 5B. Conversely, the spacing from the body region 260 to the gates 245 is about 0.150 µm for the examples of FIGS. 5C and 5D. These spacing values reflect the minimum spacing allowed by the applicable design rules of the process technology used to design these transistors. Thus, whereas minimum design rules result in a gate-to-body spacing of 0.675 µm for the baseline transistor 300, examples consistent with the disclosure allow a gate-to-body spacing less than 0.5 µm. These values demonstrate that the spacing allowed by the example layouts of FIGS. 5A-5D may results in reduction of transistor half-pitch by 10% to 20%.

TABLE I

| Layout style | Gate-to-body spacing | Half pitch |
| --- | --- | --- |
| Baseline | 0.675 µm | 2.85 µm |
| FIGS. 5A/5B | 0.375 µm | 2.55 µm |
| FIGS. 5C/5D | 0.15 µm | 2.25 µm |

Figure 7:
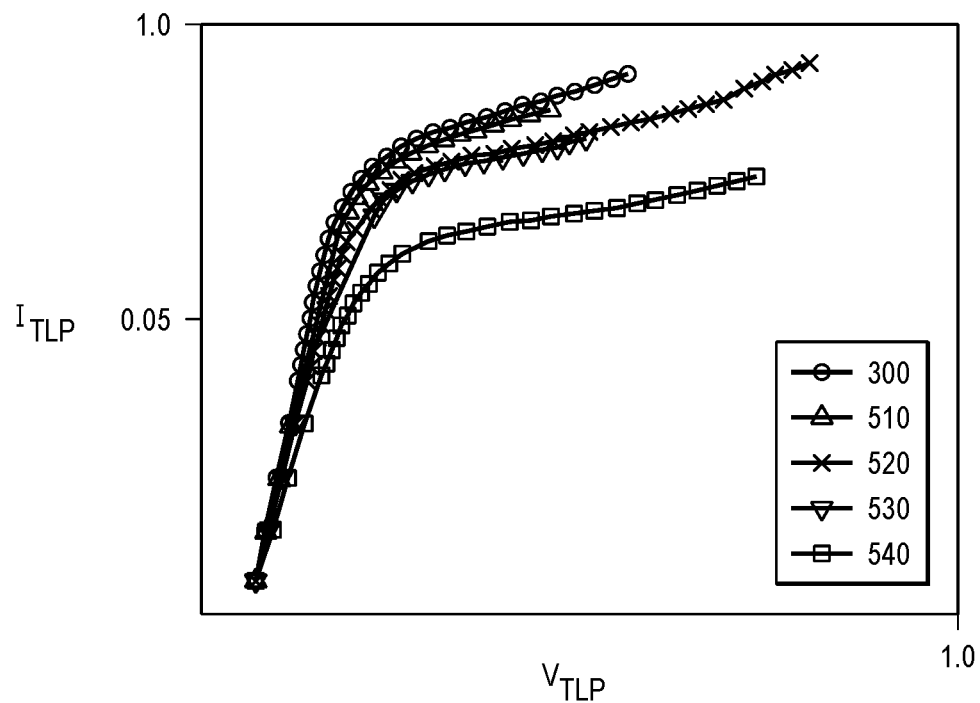
FIG. 7 illustrates normalized unit current per length for devices fabricated according to the baseline configuration of FIG. 3B, and the example configurations of FIGS. 5A-5D.
Figure 8:
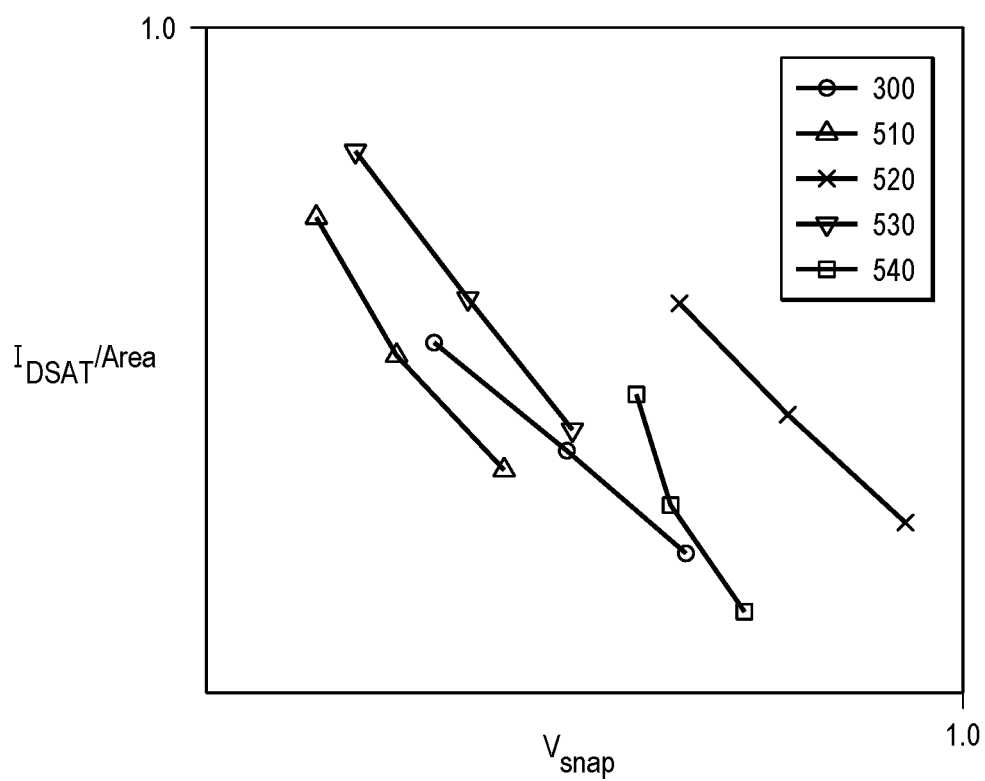
FIG. 8 illustrates normalized $I_{DSAT}$ per unit area for devices fabricated according to the baseline configuration of FIG. 3B, and the example configurations of FIGS. 5A-5D.

Example IGBT transistors with the general form of FIG. 2 were manufactured using each of the configurations 510-540, and tested electrically to determine the effect of these configurations on SOA. FIG. 7 illustrates transmission line pulse (TLP) current versus TLP voltage, and FIG. 8 presents $I_{DSAT}$ (saturation drain current) normalized by transistor area versus snapback voltage $V_{SNAP}$. These data demonstrate that the configuration 520 (FIGS. 5B, 6D and 6E) results in an improvement of current efficiency of at least a 20% relative to the baseline configuration 300 (FIGS. 3A and 3B). The configuration 540 (FIGS. 5D, 6H and 6I) provides an intermediate improvement of current efficiency with respect to the baseline configuration.

The reduction of transistor half-pitch and the improvement of current efficiency provided by examples described herein, especially of the configuration 520, demonstrate a significant and valuable improvement of IGBT device layout. The principles described herein do not require a minimum design rule layout, and the gate-to-body spacing is not limited to any particular value. But as a practical matter a spacing of 1 µm or less is expected to provide the observed improved characteristics of the transistor 200 while providing a compact design.

FIGS. 9A-9J illustrate an example method 900 that may be used as part of the formation of the transistor 200. The method 900 is but one of several possible sequences of process steps, and those skilled in the art will appreciate that some steps may be reordered, e.g. to accommodate a particular process technology or tool set. The configuration 520 is used as a specific example, but those skilled in the pertinent art will appreciate that the method 900 can be adapted to form the configurations 510, 530 and 540, and similar variations within the scope of the disclosure, without undue experimentation. In each of these figures, a section view is provided through the transistor 200 at the location at which the body region 260 is formed, and the location at which the source region 250 is formed. The method 900 is described without implied limitation in terms of some regions doped P-type and others doped N-type. Those skilled in the art will recognize that the method may be adapted to reverse the dopant types of the various regions to realize an analogous device.

Figure 9A:
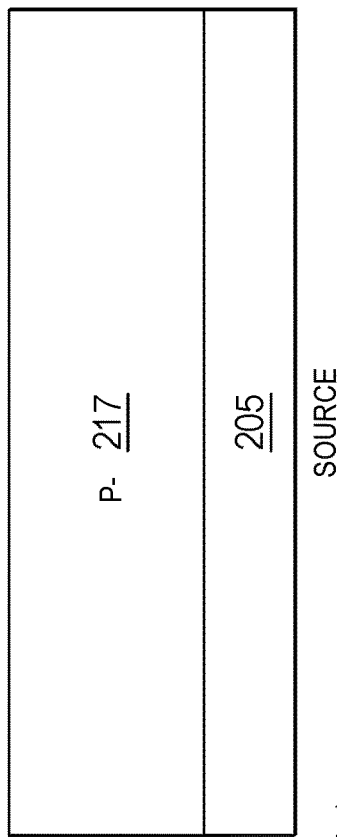
FIG. 9A-9J each show a section view through a circumscribed body region, and a source region, of an example lateral IGBT of the disclosure at various stages of manufacturing.
Figure 9A:
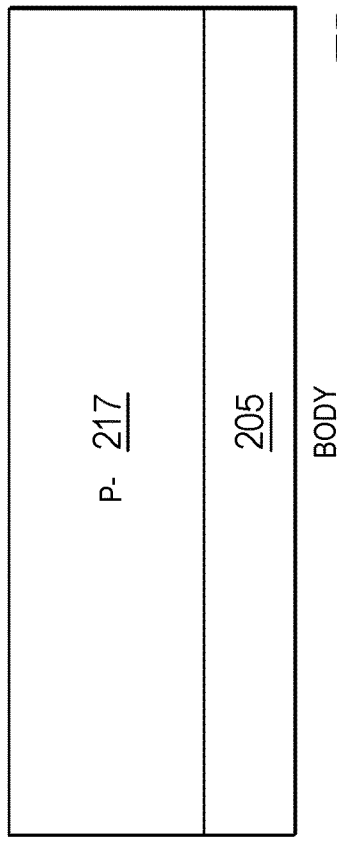

In FIG. 9A the substrate 205 is provided having the epitaxial layer 217 located thereover. The substrate 205 may optionally include a buried layer, such as an N-buried layer, or a buried insulating layer, such as an SOI layer. Optionally the epitaxial later 217 is lightly doped P-type.

Figure 9B:
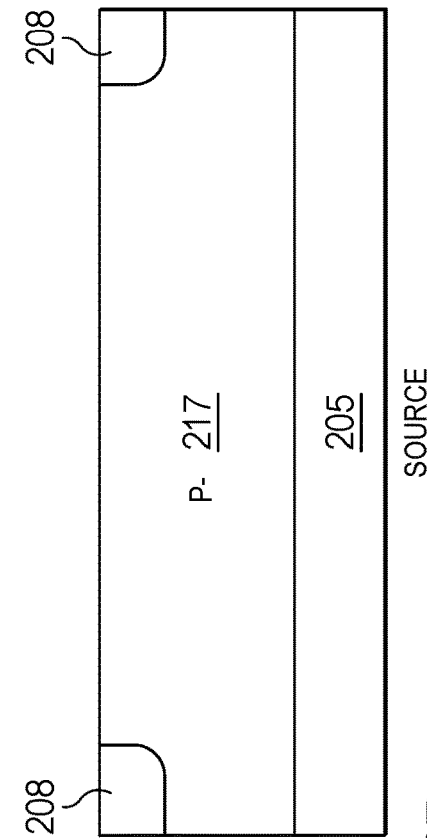
Figure 9B:
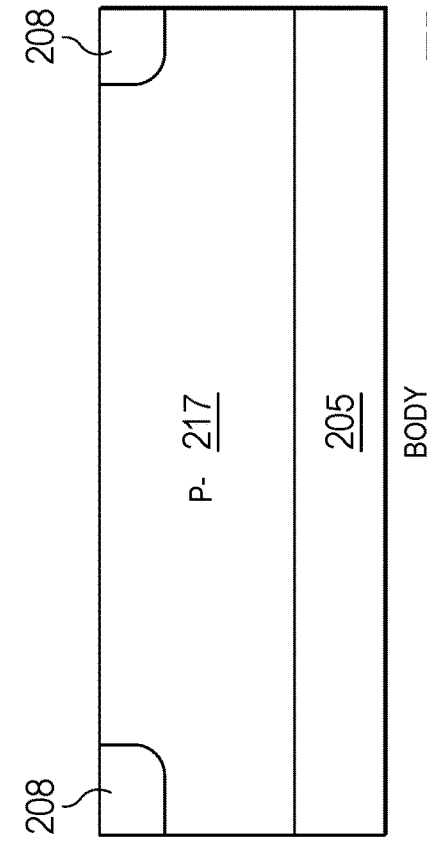

In FIG. 9B, N-drift regions 208 have been formed, e.g. by a moat implant. The formation may include conventional steps such as photoresist deposition and patterning, and ion implantation of an N-type dopant such as phosphorous to produce a dopant concentration in a range between about $1e16$ cm$^{-3}$ and about $1e18$ cm$^{-3}$. The dopant may have been diffused in an anneal step prior to this figure, or may be done in a later step at which multiple implanted regions are annealed concurrently.

Figure 9C:
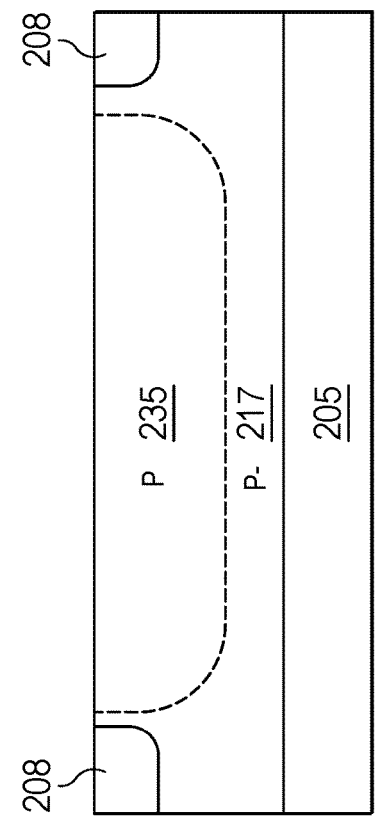
Figure 9C:
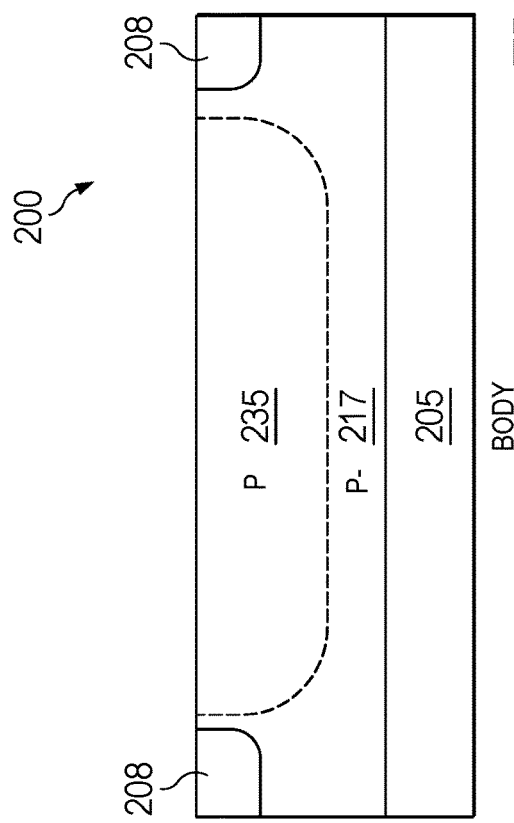

In FIG. 9C, the DWELL 235 has been implanted with a P-type dopant such a boron, and diffused into the layer 217. The DWELL 235 illustrated in this figure is representative of a DWELL that may be formed by one or more implants that may be performed before or after gate poly formation (e.g. FIG. 9E). The dopant concentration in the DWELL 235 by the one or more implants may be in a range between about $1e17$ cm$^{-3}$ and about $1e19$ cm$^{-3}$.

Figure 9D:
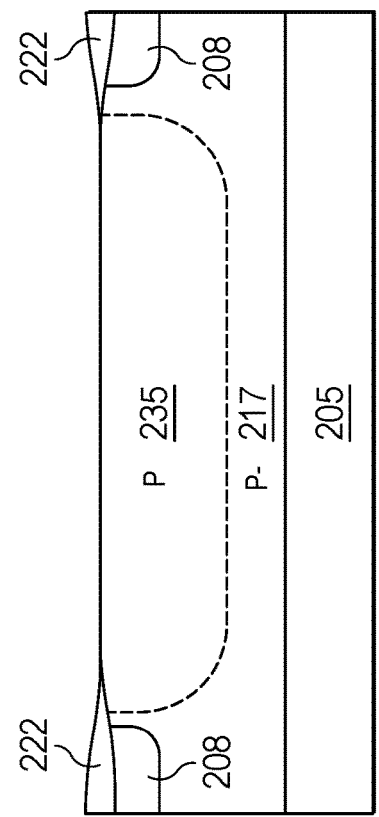
Figure 9D:
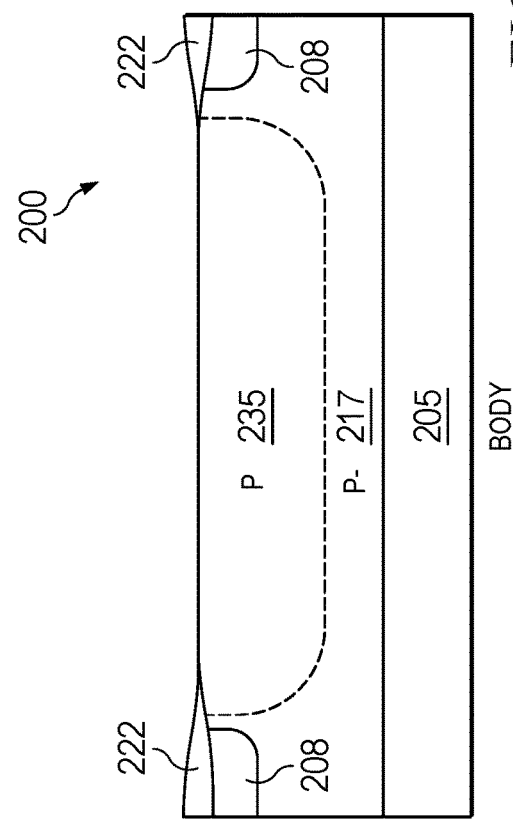

FIG. 9D shows the partially formed transistor 200 after forming LOCOS layers 222. These structures may be formed by a conventional sequence including forming and patterning a silicon nitride layer over the epitaxial layer 217, followed by steam oxidation of exposed portions of the exposed surface. The silicon nitride layer is then removed, after which a thermal oxidation may be performed to form a gate dielectric layer (not shown) at the top surface of the layer 217. In alternative examples, not shown, STI structures may be used in lieu of the LOCOS layers 222.

Figure 9E:
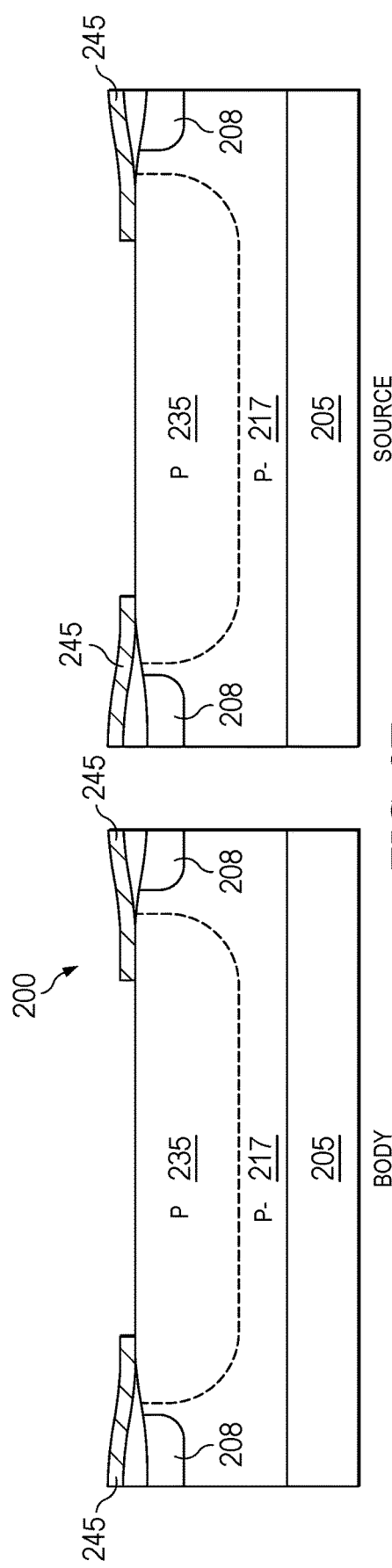

FIG. 9E shows the partially formed transistor 200 after a polysilicon layer has been formed over the doped region 235 and patterned to form the gate electrodes 245, which may be done conventionally.

Figure 9F:
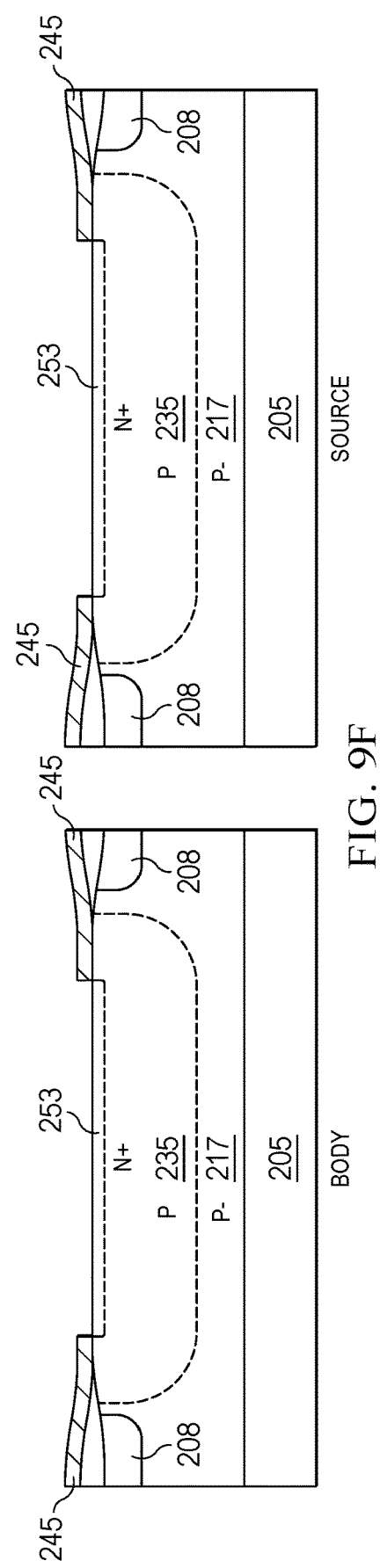

FIG. 9F shows the partially formed transistor 200 after an N-type dopant such as phosphorous has been implanted in the DWELL 235. The implant may be self-aligned, e.g. using the gate electrode 245 as a masking pattern. The partially formed transistor 200 has been annealed to diffuse the N-type dopant into the DWELL 235, which may further diffuse the P-type dopant of the DWELL 235 into the epitaxial layer 217. The diffusing results in the DWELL 235 having the dopant concentration previously described, and the source extension 253 having a dopant concentration in a range between about $1e19$ cm$^{-3}$ and about $1e20$ cm$^{-3}$. This doping level is represented symbolically by "N$^+$" for convenience. Because the source extension 253 is self-aligned to the end of the gates 245, the source extension 253 may extend partially under the gates 245 after the diffusion.

Figure 9G:
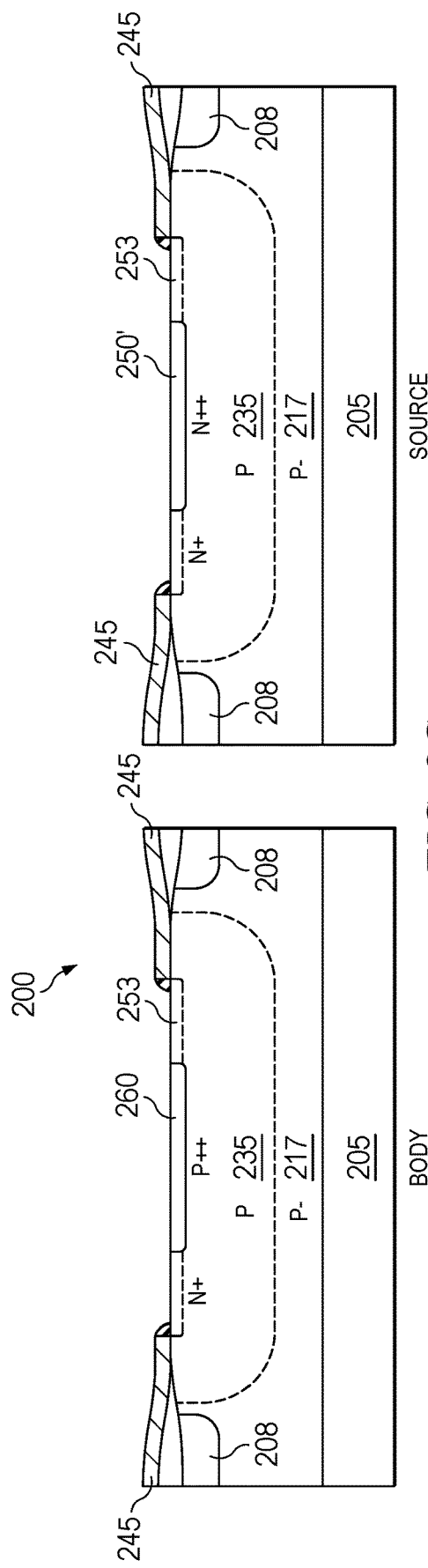

FIG. 9G shows the partially formed transistor 200 after forming unreferenced dielectric spacers on sidewalls of the gate electrodes 245. The sidewall spacers may be formed conventionally, and may include one or more dielectric layers, e.g. silicon oxide and/or silicon nitride. Further, a masked implant of a P-type dopant such as boron into the DWELL 235 has been performed, thereby forming the body region 260, and masked implant of an N-type dopant such as phosphorous into the DWELL 235 has been performed, thereby forming the source region 250'. These dopants may be implanted using process conditions similar to implanting P-source/drain (PSD) and N-source-drain (NSD) in a CMOS process technology, and may be referred to for convenience as PSD and NSD implants. The body region 260 and the source region 250' may each have a concentration of their respective dopants in a range between about 1e20 cm$^{-3}$ and about 1e21 cm$^{-3}$. These doping levels are respectively represented symbolically by "N$^{++}$" and "P$^{++}$" for convenience.

Figure 9H:
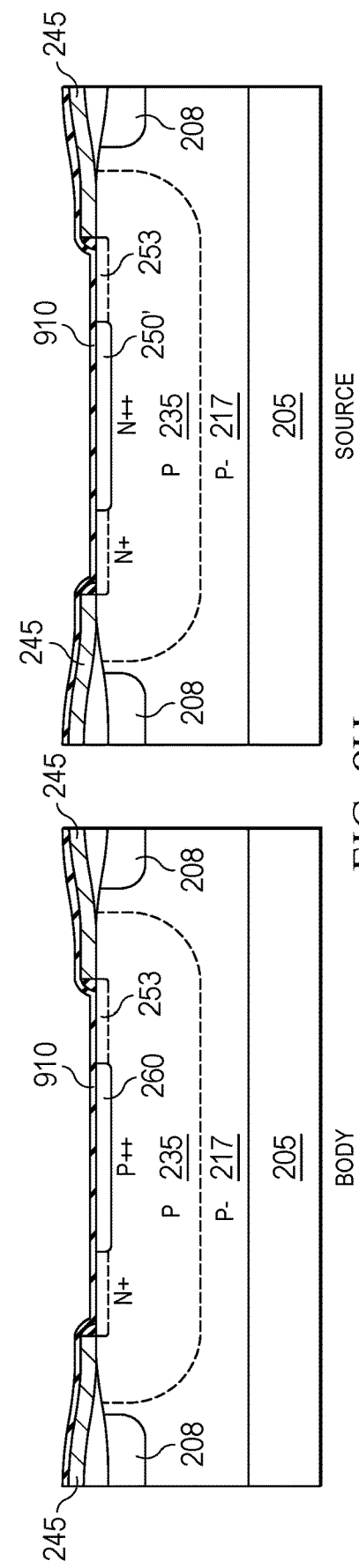

In FIG. 9H a dielectric layer 910 is formed over the gate electrodes 245, epitaxial layer 217 and sidewall spacers. The layer 910, from which the SiBLK 265 features are formed, may be any suitable dielectric layer or layers, typically characterized by being capable of being selectively removed without significant removal of other material features, such as the sidewall spacers. In some examples the layer 910 includes nitrogen, such as silicon nitride or silicon oxynitride. In some other examples the layer 910 is substantially free of nitrogen, e.g. silicon oxide. Regardless of the material type, the layer 910 is not limited to a thickness of any particular value, but may have a thickness in a range between about 20 nm and 100 nm, inclusive. A photoresist pattern (not shown) is formed over the layer 910, e.g. by conventional photolithography, to protect locations at which the dielectric structures 265 are to be formed.

Figure 9I:
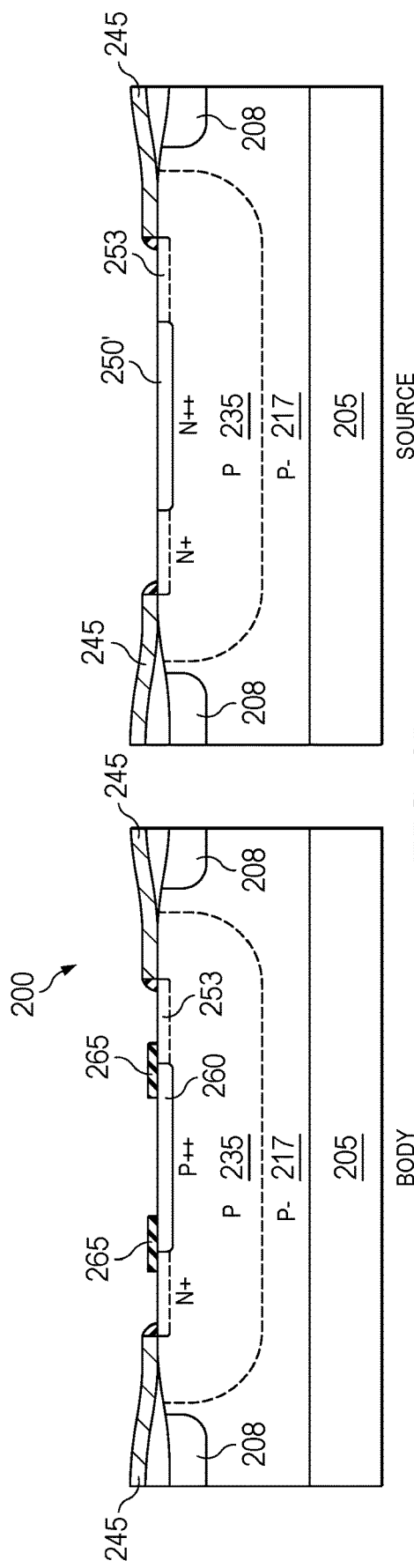
Figure 9J:
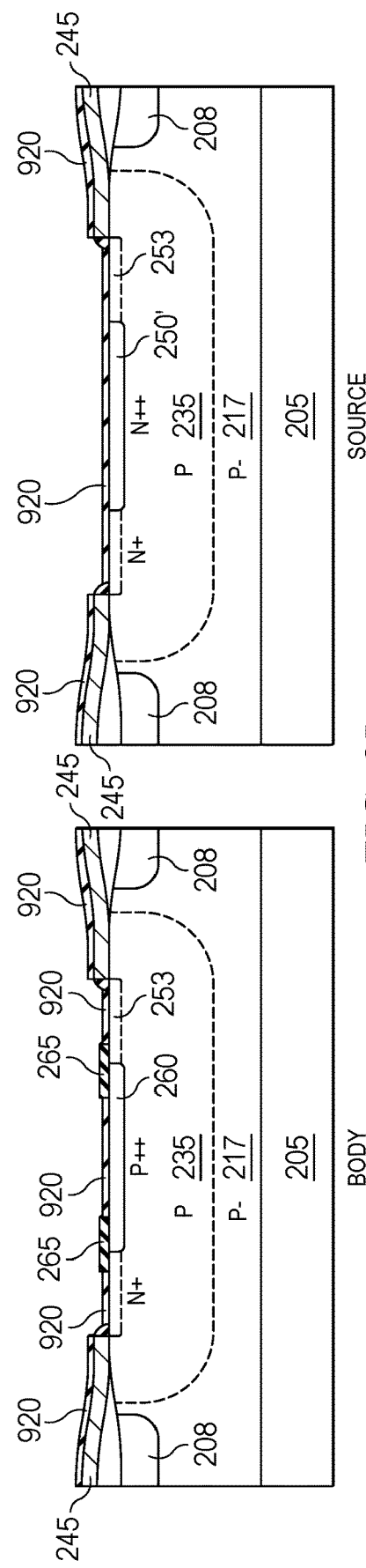

FIG. 9I shows the partially formed transistor 200 after selective removal of the layer 910, and cleanup, resulting in the SiBLK 265 features as previously described. Finally, FIG. 9J illustrates the partially formed transistor 200 after forming a silicide layer 920 on exposed portions of the gate electrodes 245, source region 250' and the body region 260. Additional processing steps, not shown, are performed to provide a dielectric layer over the gate electrodes 245, SiBLK 265, body region 260 and source region 250'. Metal contacts and interconnections are formed in or over the dielectric layer to complete the transistor 200.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
    a semiconductor substrate having a doped region with a first conductivity type;
    a source region located within the doped region, the source region having an opposite second conductivity type;
    a drain region having the second conductivity type spaced apart from the source region; and
    a gate electrode between the source region and the drain region, the gate electrode partially overlapping the doped region;
    a heavily-doped body region having the first conductivity type located within the doped region and directly touching the source region; and
    a first dielectric layer that forms a closed path around the body region and extends along a top surface of the source region and a top surface of the body region over a junction between the source region and the body region; and
    a second dielectric layer that laterally abuts the first dielectric layer and is located on the top surface of the source region and the top surface of the body region.

2. The integrated circuit of claim 1, wherein the first dielectric layer comprises silicon oxynitride.

3. The integrated circuit of claim 1, wherein the first dielectric layer encloses a rectangular area.

4. The integrated circuit of claim 1, wherein a source extension is located between the source region and the gate electrode, the source extension having a lower dopant concentration than the source region.

5. The integrated circuit of claim 1, wherein the closed path is a first closed path enclosing a first body region, and the first dielectric layer forms a second closed path enclosing a second body region, further comprising a plurality of metal contacts conductively connected to the source region directly between the first and second closed paths.

6. The integrated circuit of claim 1, wherein a space between the gate electrode and the body region is less than 1 μm.

7. The integrated circuit of claim 1, wherein the source region, the drain region and the gate electrode are components of an insulated-gate bipolar transistor.

8. The integrated circuit of claim 1, wherein the first conductivity type is P-type and the second conductivity type is N-type.

9. A method of manufacturing an integrated circuit, comprising:
    forming a doped region having a first conductivity type in a semiconductor substrate;
    forming a source region within the doped region, the source region having an opposite second conductivity type;
    forming a drain region having the second conductivity type spaced apart from the source region;
    forming a gate electrode between the source region and the drain region, the gate electrode partially overlapping the doped region;
    forming a body region having the first conductivity type within the doped region;
    forming a first dielectric layer that forms a closed path around the body region and is located on a top surface of the source region and a top surface of the body region and touches a junction between the source region and the body region; and
    forming a second dielectric layer that laterally abuts the first dielectric layer and is located on the top surface of the source region and the top surface of the body region.

10. The method of claim 9, wherein the first dielectric layer comprises silicon nitride.

11. The method of claim 9, wherein the first dielectric layer encloses a rectangular area.

12. The method of claim 9, wherein the body region touches the source region.

13. The method of claim 9, wherein the closed path is a first closed path enclosing a first body region, and the first dielectric layer forms a second closed path enclosing a second body region, further comprising forming a plurality of metal contacts conductively connected to the source region directly between the first and second closed paths.

14. The method of claim 9, wherein a space between the gate electrode and the body region is less than 0.5 µm.

15. The method of claim 9, wherein the source region, the drain region and the gate electrode are components of an insulated-gate bipolar transistor.

16. The method of claim 9, wherein the first conductivity type is p-type and the second conductivity type is n-type.

17. An integrated circuit, comprising:
an epitaxial layer located over a semiconductor substrate and having a first conductivity type;
first and second drift regions within the epitaxial layer and having an opposite second conductivity type;
a doped region having the first conductivity type within the epitaxial layer between the first and second drift regions;
first and second drain regions having the second conductivity type respectively located in the first and second drift regions; and
first and second source regions having the second conductivity type and spaced apart within the doped region;
a first gate electrode between the first drain region and the first source region, and a second gate electrode between the second drain region and the second source region;
a heavily-doped body region having the first conductivity type located within the doped region and between the first and second source regions, and forming a first junction with the first source region and a second junction with the second source region;
a silicide blocking layer that forms a closed path around the body region and is located on top surfaces of the first and second source regions and a top surface of the body region and overlaps the first and second junctions; and
a dielectric layer over the silicide blocking layer that is located on the top surfaces of the first and second source regions and the top surface of the body region,
wherein the first and second source regions provide a source contact of an insulated-gate bipolar transistor (IGBT), and the body region provides a collector contact of the IGBT.

18. The integrated circuit of claim 17, wherein the silicide blocking layer comprises silicon nitride.

19. An integrated circuit, comprising:
a semiconductor substrate having a doped region with a first conductivity type;
a source region located within the doped region, the source region having an opposite second conductivity type;
a drain region having the second conductivity type spaced apart from the source region; and
a gate electrode between the source region and the drain region, the gate electrode partially overlapping the doped region;
a heavily-doped body region having the first conductivity type located within the doped region and directly touching the source region; and
a dielectric layer that forms a closed path around the body region and a contiguous portion of the dielectric layer overlies the gate electrode and is directly on the body region.

20. The integrated circuit of claim 19, wherein the source region provides a source contact of an insulated-gate bipolar transistor (IGBT), and the body region provides a collector contact of the IGBT.

21. An integrated circuit, comprising:
a semiconductor substrate having a doped region with a first conductivity type;
a source region located within the doped region, the source region having an opposite second conductivity type;
a drain region having the second conductivity type spaced apart from the source region; and
a gate electrode between the source region and the drain region, the gate electrode partially overlapping the doped region;
a heavily-doped body region having the first conductivity type located within the doped region and directly touching the source region; and
a contiguous dielectric layer that forms a closed path around the body region and extends along a top surface of the body region and over the gate electrode.

* * * * *